(12) United States Patent
Kim et al.

(10) Patent No.: US 12,382,799 B2
(45) Date of Patent: Aug. 5, 2025

(54) DISPLAY DEVICE AND METHOD OF FABRICATING THE SAME

(71) Applicant: Samsung Display Co., Ltd., Yongin-si (KR)

(72) Inventors: Seul Ki Kim, Incheon (KR); Kap Soo Yoon, Seoul (KR); Jae Hyun Lee, Gwacheon-si (KR); Seung Ha Choi, Hwaseong-si (KR); Jong Bum Choi, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 512 days.

(21) Appl. No.: 17/831,387

(22) Filed: Jun. 2, 2022

(65) Prior Publication Data

US 2023/0053184 A1 Feb. 16, 2023

(30) Foreign Application Priority Data

Aug. 10, 2021 (KR) .................. 10-2021-0104976

(51) Int. Cl.
*H10K 59/131* (2023.01)
*H10K 71/00* (2023.01)
(Continued)

(52) U.S. Cl.
CPC .......... *H10K 59/131* (2023.02); *H10K 71/00* (2023.02); *H10K 59/1201* (2023.02); *H10K 59/126* (2023.02)

(58) Field of Classification Search
CPC .. H10K 59/131; H10K 71/00; H10K 59/1201; H10K 59/126; H10K 50/865;
(Continued)

(56) References Cited

U.S. PATENT DOCUMENTS 8,395,160 B2 * 3/2013 Park .................. H10K 59/80517
349/39
11,271,061 B2 3/2022 Kim et al.
(Continued)

FOREIGN PATENT DOCUMENTS

KR 10-1920770 11/2018
KR 2020-0019309 2/2020
(Continued)

*Primary Examiner* — Fernando L Toledo
*Assistant Examiner* — Shawn Shaw Muslim
(74) *Attorney, Agent, or Firm* — KILE PARK REED & HOUTTEMAN PLLC

(57) ABSTRACT

A display device and a method of fabricating the same, the display device including a light-blocking layer disposed on a substrate, a buffer layer disposed on the light-blocking layer, a semiconductor layer disposed on the buffer layer, a gate insulating layer disposed on the semiconductor layer, a connection pattern layer and a gate electrode disposed on the gate insulating layer and spaced apart from each other, an interlayer dielectric layer disposed on the connection pattern layer and the gate electrode, a via layer disposed on the interlayer dielectric layer, a first bridge layer and a second bridge layer disposed on the via layer, a pixel electrode disposed on the second bridge layer, and a light-emitting layer disposed on the pixel electrode. An end of the first bridge layer is connected to the light-blocking layer through the connection pattern layer, and another end thereof is connected to the semiconductor layer. The second bridge layer connects the semiconductor layer with the pixel electrode.

26 Claims, 22 Drawing Sheets

(51) Int. Cl.
*H10K 59/12* (2023.01)
*H10K 59/126* (2023.01)

(58) Field of Classification Search
CPC ...... H10K 59/38; H10K 50/86; H10K 59/123; H10K 59/124
See application file for complete search history.

(56) References Cited

U.S. PATENT DOCUMENTS

| | | | |
|---|---|---|---|
| 2016/0163769 A1* | 6/2016 | Lee | H10K 50/844 |
| | | | 438/23 |
| 2018/0033979 A1* | 2/2018 | Jang | B32B 27/32 |
| 2020/0212131 A1* | 7/2020 | Kim | H10K 59/126 |
| 2021/0020721 A1 | 1/2021 | Kwack et al. | |
| 2021/0104590 A1* | 4/2021 | Kim | H01L 27/1225 |
| 2022/0181411 A1 | 6/2022 | Kim et al. | |

FOREIGN PATENT DOCUMENTS

| | | |
|---|---|---|
| KR | 2021-0008768 | 1/2021 |
| KR | 10-2022-0080801 | 6/2022 |
| KR | 20230033058 | 3/2023 |

\* cited by examiner

DISPLAY DEVICE AND METHOD OF FABRICATING THE SAME

This application claims priority from and the benefit of Korean Patent Application 10-2021-0104976, filed on Aug. 10, 2021, which is hereby incorporated by reference for all purposes as if fully set forth herein.

BACKGROUND

Field

Embodiments of the invention relate generally to a display device and a method of fabricating the same.

Discussion of the Background

As the information-oriented society evolves, various demands for display devices are continually increasing. For example, display devices are being employed by a variety of electronic devices, such as smart phones, digital cameras, laptop computers, navigation devices, and smart televisions.

Display devices may be flat panel display devices, such as a liquid-crystal display device, a field emission display device, and a light-emitting display device. Light-emitting display devices include an organic light-emitting display device including an organic light-emitting element, an inorganic light-emitting display device including an inorganic light-emitting element such as an inorganic semiconductor, and a micro-light-emitting display device including an ultra-small light-emitting element.

An organic light-emitting element may include two opposing electrodes and a light-emitting layer interposed therebetween. Electrons and holes supplied from the two electrodes are recombined in the light-emitting layer to generate excitons, and the generated excitons relax from the excited state to the ground state so that light can be emitted.

An organic light-emitting display device including organic light-emitting elements requires no separate light source, such as a backlight unit, and thus, it consumes less power and can be made light and thin, as well as exhibiting high-quality characteristics, such as a wide viewing angle, high luminance and contrast, and fast response speed. Accordingly, an organic light-emitting display device is attracting attention as the next generation display device.

The above information disclosed in this Background section is only for understanding of the background of the inventive concepts, and, therefore, it may contain information that does not constitute prior art.

SUMMARY

Embodiments of the present invention provide a display device with a simpler structure and process, and a method of fabricating the same.

Additional features of the inventive concepts will be set forth in the description which follows, and in part will be apparent from the description, or may be learned by practice of the inventive concepts.

An embodiment of the present invention provides a display device including a light-blocking layer disposed on a substrate, a buffer layer disposed on the light-blocking layer, a semiconductor layer disposed on the buffer layer, a gate insulating layer disposed on the semiconductor layer, a connection pattern layer and a gate electrode disposed on the gate insulating layer and spaced apart from each other, an interlayer dielectric layer disposed on the connection pattern layer and the gate electrode, a via layer disposed on the interlayer dielectric layer, a first bridge layer and a second bridge layer disposed on the via layer, a pixel electrode disposed on the second bridge layer, a light-emitting layer disposed on the pixel electrode, and a common electrode disposed on the light-emitting layer. An end of the first bridge layer is connected to the light-blocking layer through the connection pattern layer, and another end thereof is connected to the semiconductor layer, and wherein the second bridge layer connects the semiconductor layer with the pixel electrode.

The connection pattern layer and the gate electrode may be disposed on a same layer and include a same material.

The connection pattern layer may be in contact with the light-blocking layer through a first contact hole penetrating the gate insulating layer and the buffer layer.

One end of the first bridge layer may be in contact with the connection pattern layer through a second contact hole penetrating the interlayer dielectric layer and a first via hole penetrating the via layer.

Another end of the first bridge layer may be in contact with a portion of the semiconductor layer through a third contact hole penetrating the interlayer dielectric layer and a second via hole penetrating the via layer.

The second bridge layer may be in contact with another portion of the semiconductor layer through a fourth contact hole penetrating the interlayer dielectric layer and a third via hole penetrating the via layer.

The first bridge layer and the second bridge layer may include a metal oxide, and the metal oxide may include one selected from a group consisting of: ITO, IZO, ZnO, and $In_2O_3$.

The first bridge layer and the second bridge layer may include a polycrystalline metal oxide.

The first bridge layer may include a first electrode layer, a second electrode layer disposed on the first electrode layer, a third electrode layer disposed on the second electrode layer, and a fourth electrode layer disposed on the third electrode layer.

The first electrode layer, the second electrode layer and the fourth electrode layer may include a metal oxide, and the first electrode layer may include a polycrystalline metal oxide.

Another embodiment of the present invention provides a display device including a substrate including a display area and a pad area, a light-blocking layer disposed on the display area of the substrate and a lower pad electrode disposed on the pad area of the substrate, a buffer layer disposed on the light-blocking layer and the lower pad electrode, a semiconductor layer disposed on the buffer layer and overlapping the light-blocking layer, a gate insulating layer disposed on the semiconductor layer, a connection pattern layer and a gate electrode disposed on the gate insulating layer in the display area, an upper pad electrode disposed on the gate insulating layer in the pad area and overlapping the lower pad electrode, an interlayer dielectric layer disposed on the connection pattern layer, the gate electrode and the lower pad electrode, a via layer disposed on the interlayer dielectric layer, a first bridge layer and a second bridge layer disposed on the via layer in the display area, a pad capping layer disposed on the pad area and overlapping the upper pad electrode, a pixel electrode disposed on the second bridge layer, a light-emitting layer disposed on the pixel electrode, and a common electrode disposed on the light-emitting layer. The first bridge layer, the second bridge layer, and the pad capping layer include a polycrystalline metal oxide.

The upper pad electrode may be in contact with the lower pad electrode through a first contact hole penetrating the buffer layer and the gate insulating layer.

The pad capping layer may be in contact with the upper pad electrode through a second contact hole penetrating the interlayer dielectric layer.

One end of the first bridge layer may be connected to the light-blocking layer through the connection pattern layer, and another end of the first bridge layer is connected to the semiconductor layer. The second bridge layer connects the semiconductor layer with the pixel electrode.

The connection pattern layer may be in contact with the light-blocking layer through a third contact hole penetrating the gate insulating layer and the buffer layer.

One end of the first bridge layer may be in contact with the connection pattern layer through a fourth contact hole penetrating the interlayer dielectric layer and a first via hole penetrating the via layer, and another end of the first bridge layer may be in contact with a portion of the semiconductor layer through a fifth contact hole penetrating the interlayer dielectric layer and a second via hole penetrating the via layer. The second bridge layer may be in contact with another portion of the semiconductor layer through a sixth contact hole penetrating the interlayer dielectric layer and a third via hole penetrating the via layer.

The first bridge layer, the second bridge layer, and the pad capping layer include one selected from a group consisting of: ITO, IZO, ZnO, and $In_2O_3$.

Another embodiment of the present invention provides a method of fabricating a display device, the method including forming a light-blocking layer and a lower pad electrode on a substrate, forming a buffer layer on the light-blocking layer and the lower pad electrode, forming a semiconductor layer overlapping the light-blocking layer on the buffer layer, forming a gate insulating layer on the semiconductor layer, forming a connection pattern layer, a gate electrode, and an upper pad electrode on the gate insulating layer, forming an interlayer dielectric layer on the connection pattern layer, the gate electrode, and the lower pad electrode, forming a via layer on the interlayer dielectric layer, forming a first bridge layer and a second bridge layer on the via layer, and forming a pad capping layer overlapping the upper pad electrode, converting the first bridge layer, the second bridge layer and the pad capping layer into a polycrystalline phase, forming a pixel electrode on the second bridge layer, forming a light-emitting layer on the pixel electrode, and forming a common electrode on the light-emitting layer.

The converting may include performing heat treatment on the substrate on which the first bridge layer, the second bridge layer, and the pad capping layer are formed at a temperature of 150 to 200 degrees Celsius.

The connection pattern layer, the gate electrode, and the upper pad electrode may be formed via a same mask process.

The method may include, prior to the forming the connection pattern layer, the gate electrode, and the upper pad electrode, etching the gate insulating layer and the buffer layer to form a first contact hole exposing the light-blocking layer and a second contact hole exposing the lower pad electrode. The connection pattern layer may be in contact with the light-blocking layer through the first contact hole, and the upper pad electrode may be in contact with the lower pad electrode through the second contact hole.

The method may include, after the forming the via layer on the interlayer insulating layer, etching the via layer and the interlayer dielectric layer to form a third contact hole and a first via hole exposing the connection pattern layer, and to form a fourth contact hole and a second via hole exposing the lower pad electrode. The first bridge layer may be in contact with the connection pattern layer through a third contact hole and the first via hole, and the pad capping layer may be in contact with the upper pad electrode through the fourth contact hole and the second via hole.

According to the inventive concepts, a source/drain electrode layer is replaced with a third conductive layer disposed on a via layer in a display device, and thus, there are advantages in that a semiconductor layer can be connected to a light-blocking layer with a simple structure and process, and that pad electrodes can be protected.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION OF THE EMBODIMENTS

Figure 1:
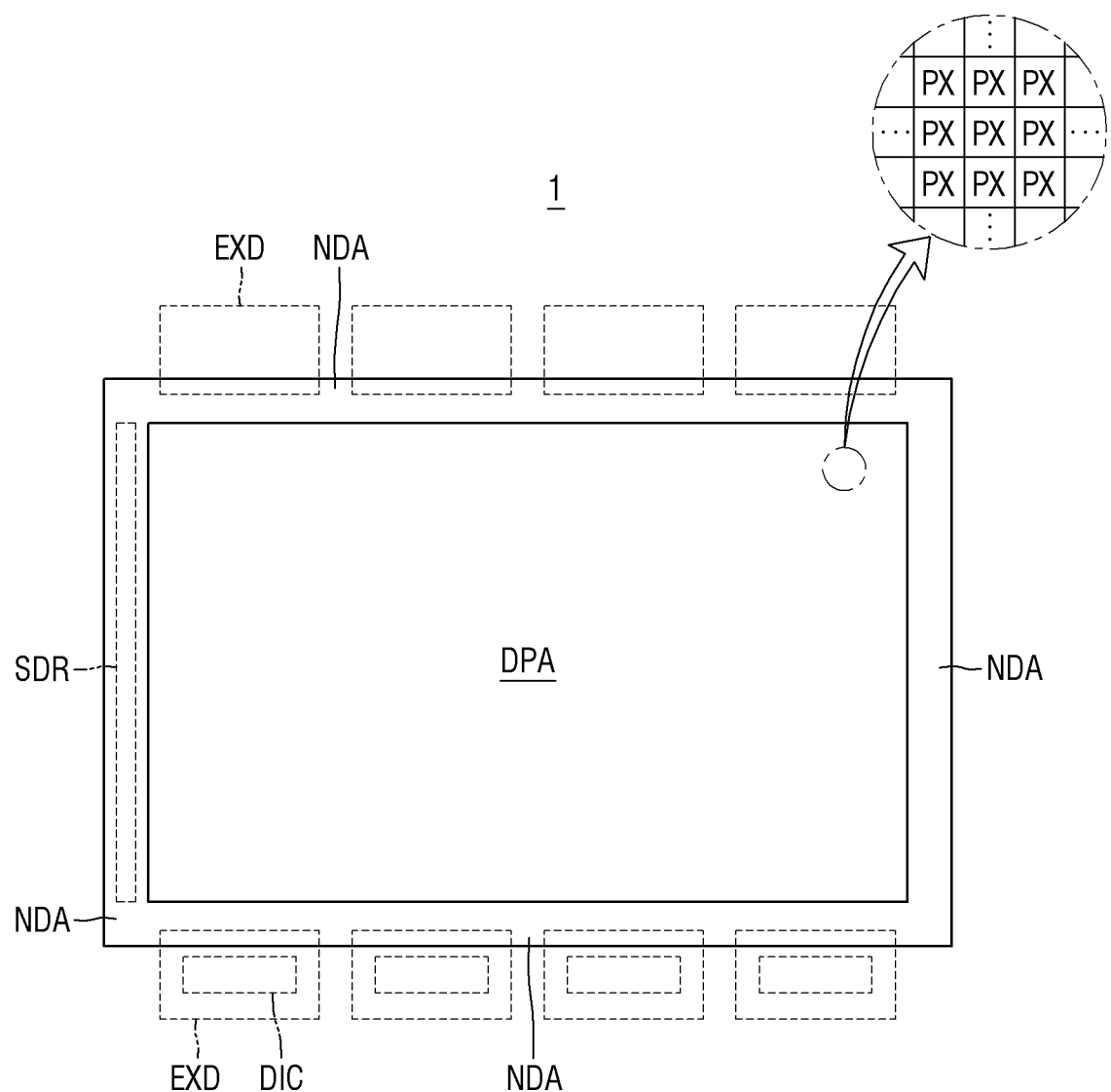
FIG. 1 is a plan view of a display device according to an embodiment of the present invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a plan view of a display device according to an embodiment of the present invention.

Referring to FIG. 1, a display device 1 according to an embodiment of the present invention may be applied to a smart phone, a mobile phone, a tablet PC, a personal digital assistant (PDA), a portable multimedia player (PMP), a television set, a game machine, a wristwatch-type electronic device, a head-mounted display, a personal computer monitor, a laptop computer, a car navigation system, a car instrument cluster, a digital camera, a camcorder, an outdoor billboard, an electronic billboard, various medical apparatuses, various home appliances such as a refrigerator and a laundry machine, Internet of things (IoT) devices, etc. In the following description, a television is described as an example of the display device. The television may have a high resolution or ultra high resolution, such as HD, UHD, 4K, and 8K.

In addition, the display device 1 according to the embodiments may be variously classified by the way in which images are displayed. Examples of the classification of display devices may include an organic light-emitting display device (OLED), an inorganic light-emitting display device (inorganic EL), a quantum-dot light-emitting display device (QED), a micro LED display device (micro-LED), a nano LED display device (nano-LED), a plasma display device (PDP), a field emission display device (FED), a cathode ray display device (CRT), a liquid-crystal display device (LCD), an electrophoretic display device (EPD), etc. In the following description, an organic light-emitting display device will be described as an example of the display device, and the organic light-emitting display device will be simply referred to as a display device unless it is necessary to distinguish it from others. It is, however, to be understood that the inventive concepts are not limited to the organic light-emitting display device, and one of the above-listed display devices or any other display device well known in the art may be employed without departing from the scope of the inventive concepts.

According to an embodiment, the display device 1 may have a square shape, e.g., a rectangular shape when viewed from the top. When the display device 1 is a television, it is oriented such that the longer sides are extended in the horizontal direction. It should be understood, however, that the inventive concepts are not limited thereto. The longer sides may be positioned in the vertical direction. Alternatively, the display device 1 may be installed rotatably so that the longer sides may variably be positioned in either the horizontal direction or the vertical direction.

The display device 1 may include a display area DPA and a non-display area NDA. The display area DPA may be an active area where images are displayed. The display area DPA may have, but is not limited to, a rectangular shape similar to the general shape of the display device 1 when viewed from the top.

The display area DPA may include a plurality of pixels PX. The plurality of pixels PX may be arranged in a matrix. The shape of each of the pixels PX may be, but is not limited to, a rectangle or a square when viewed from the top. Each of the pixels PX may have a diamond shape having sides inclined with respect to a side of the display device 1. The plurality of pixels PX may include different color pixels PX. For example, the plurality of pixels PX may include, but are not limited to, a red first color pixel PX, a green second color pixel PX, and a blue third color pixel PX. The stripe-type pixels and Pentile™ type pixels may be arranged alternately.

The non-display area NDA may be disposed around the display area DPA. The non-display area NDA may surround the display area DPA entirely or partially. The display area DPA may have a rectangular shape, and the non-display area NDA may be disposed to be adjacent to the four sides of the display area DPA. The non-display area NDA may form the bezel of the display device 1.

In the non-display areas NDA, a driving circuit or a driving element for driving the display area DPA may be disposed. According to an embodiment, a pad area is disposed on the display substrate of the display device 1 in a first non-display area NDA disposed adjacent to a first longer side (the lower side in FIG. 1) of the display device 1 and a second non-display area NDA adjacent to a second longer side (the upper side in FIG. 1) of the display device 1. An external device EXD may be mounted on a pad electrode of the pad area. Examples of the external devices EXD may include a connection film, a printed circuit board, a driver chip DIC, a connector, a line connection film, etc. A scan driver SDR formed directly on the display substrate of the display device 1 may be disposed in the third non-display area NDA disposed adjacent to a first shorter side of the display device 1 (the left side in FIG. 1).

Figure 2:
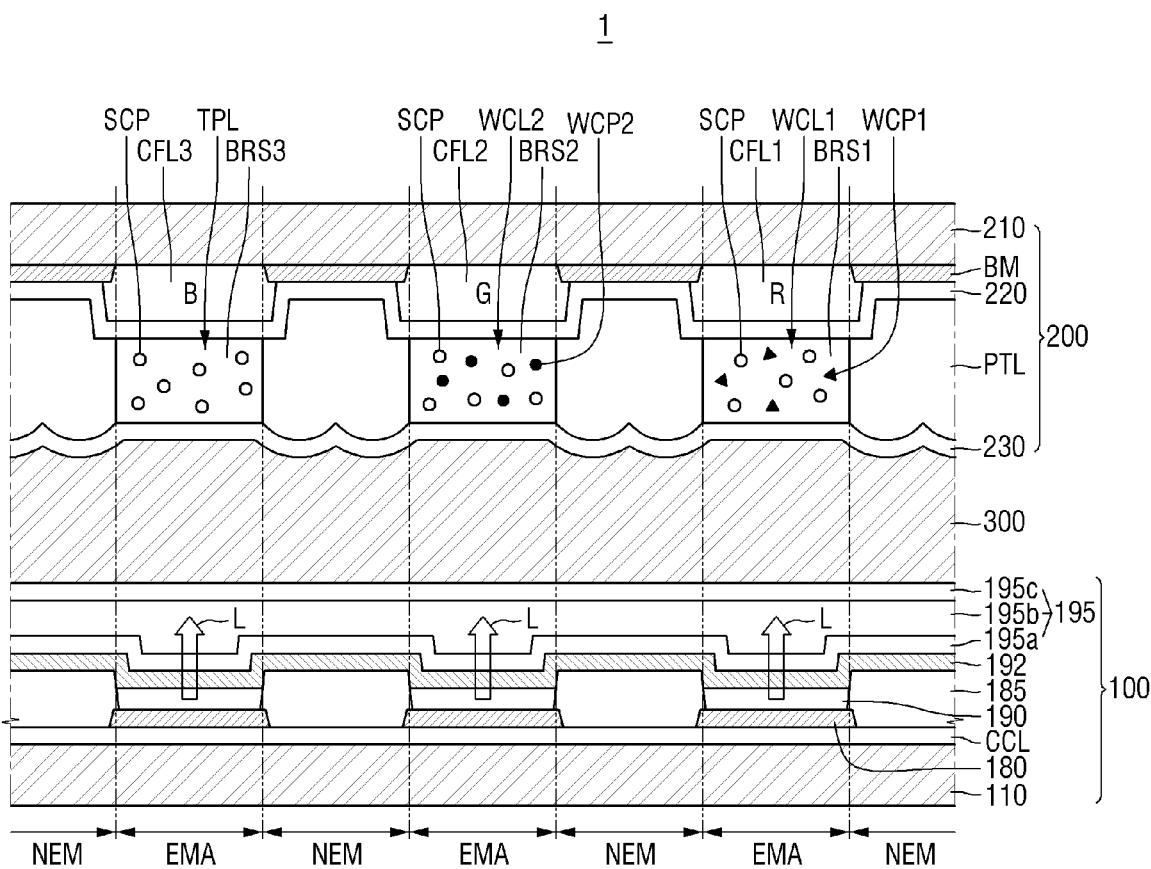
FIG. 2 is a cross-sectional view of a display device according to an embodiment of the present invention.

FIG. 2 is a cross-sectional view of a display device according to an embodiment.

In the example shown in FIG. 2, a top-emission display device is shown, in which light L is output toward the second substrate 210 rather than the first substrate 110 on which the light-emitting layer 190 is formed. It should be understood, however, that the inventive concepts are not limited thereto. A bottom-emission display device in which light is output toward the first substrate 110 on which the light-emitting layer 190 is formed, or a dual-emission display device in which light is output toward both the first substrate 110 and the second substrate 210 may be employed as the display device.

Referring to FIG. 2, the display device 1 may include a first display substrate 100, a second display substrate 200 facing the first display substrate 100, and a filling layer 300 attaching them together.

The first display substrate 100 may include the first substrate 110. The first substrate 110 may be an insulating substrate. The first insulating layer 110 may include a transparent material. For example, the first substrate 110 may include a transparent insulating material, such as glass or quartz. The first substrate 110 may be a rigid substrate. However, the first substrate 110 is not limited to those described above. The first substrate SUB 110 may include a plastic, such as polyimide, or may be flexible so that it can be curved, bent, folded, or rolled.

A plurality of pixel electrodes 180 may be disposed on the first substrate 110. The plurality of pixel electrodes 180 may be disposed in the pixels PX, respectively. The pixel electrode 180 of one of the pixels PX may be separated from another pixel electrode of a pixel PX adjacent to it. A circuit layer CCL driving the pixels PX may be disposed on the first substrate 110. The circuit layer CCL may be disposed between the first substrate 110 and the pixel electrodes 180. The circuit layer CCL will be described in detail later.

Each of the pixel electrodes 180 may be a first electrode, e.g., an anode electrode of a light-emitting diode. The pixel electrode 180 may have a stack structure of a material layer having a high work function such as indium-tin-oxide (ITO), indium-zinc-oxide (IZO), zinc oxide (ZnO) and indium oxide (111203), and a reflective material layer such as silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca) or a mixture thereof. A material layer having a higher work function may be disposed on a higher layer than a reflective material layer so that it may be closer to a light-emitting layer 190. The pixel electrode 180 may have, but is not limited to, a multilayer structure of ITO/Mg, ITO/MgF, ITO/Ag, and ITO/Ag/ITO.

A pixel-defining layer 185 may be disposed on a surface of the first substrate 110 along the boundaries of the pixels PX. The pixel-defining layer 185 may be disposed over the pixel electrodes 180 and may include openings exposing the pixel electrodes 180. An emission area EMA and the non-emission area NEM may be separated by the bank layer 185 and the opening thereof. The bank 185 may include an organic insulating material, such as polyacrylate resin, epoxy resin, phenolic resin, polyamide resin, polyimide resin, unsaturated polyesters resin, poly phenylen ether resin, poly phenylene sulfide resin, and benzocyclobutene (BCB). The pixel-defining layer 185 may include an inorganic material.

The light-emitting layer 190 may be disposed on the pixel electrode 180 exposed by the pixel-defining layer 185. In an embodiment where the display device 1 is an organic light-emitting display device, the light-emitting layer 190 may include an organic layer including an organic material. The organic layer includes an organic, emissive layer and may further include at least one of a hole injection layer, a hole transport layer, an electron injection layer and an electronic transport layer as an auxiliary layer in some implementations to facilitate emission. In another embodiment where the display device 1 is a micro LED display device, a nano LED display device, etc., the light-emitting layer 190 may include an inorganic material, such as an inorganic semiconductor.

In some embodiments, the light-emitting layer 190 may have a tandem structure including a plurality of organic emissive layers overlapping one another in the thickness direction and a charge generation layer disposed therebetween. The organic emissive layers overlapping one another may emit either light of the same wavelength or lights of different wavelengths. At least some of the light-emitting layers 190 of the pixels PX may be separated from the counterpart layers of the adjacent pixels PX.

According to an embodiment, the light-emitting layers 190 of the different color pixels PX may emit light of the same wavelength. For example, the light-emitting layer 190 of each color pixel PX emits blue light or ultraviolet light, and a color control structure to be described later includes a wavelength conversion layer WCL, so that different pixels PX can display lights of different colors.

According to another embodiment, the light-emitting layers 190 of different color pixels PX may emit lights of different wavelengths. For example, the light-emitting layer 190 of a first color pixel PX may emit light of a first color, the light-emitting layer 190 of a second color pixel PX may emit light of a second color, and the light-emitting layer 190 of a third color pixel PX may emit light of a third color.

A common electrode 192 may be disposed on the light-emitting layer 190. The common electrode 192 may be in contact with the light-emitting layer 190 as well as the upper surface of the pixel-defining layer 185.

The common electrode 192 may be extended across the pixels PX. The common electrode 192 may be disposed on the entire surface across the pixels PX. The common electrode 192 may be a second electrode, i.e., a cathode electrode of the light-emitting diode.

The common electrode 192 may include a material layer having a small work function, such as Li, Ca, LiF/Ca, LiF/Al, Al, Mg, Ag, Pt, Pd, Ni, Au, Nd, Ir, Cr, BaF and Ba, or a compound or mixture thereof (e.g., a mixture of Ag and Mg). The common electrode 192 may further include a transparent metal oxide layer disposed on the material layer having a small work function.

The pixel electrode 180, the light-emitting layer 190, and the common electrode 192 may form a light-emitting element, e.g., an organic light-emitting element. Light emitted from the light-emitting layer 190 may pass through the common electrode 192 to exit upwardly.

A thin-film encapsulation structure 195 may be disposed above the common electrode 192. The thin-film encapsulation structure 195 may include at least one thin-film encapsulation layer. For example, the thin-film encapsulation layer may include a first inorganic layer 195a, an organic layer 195b, and a second inorganic layer 195c. Each of the first inorganic layer 195a and the second inorganic layer 195c may include silicon nitride ($SiN_x$), silicon oxide ($SiO_x$), or silicon oxynitride ($SiO_xN_y$). The organic layer 195b may include an organic insulating material, such as polyacrylate resin, epoxy resin, phenolic resin, polyamide resin, polyimide resin, unsaturated polyesters resin, polyphenylene ether resin, polyphenylene sulfide resin, and benzocyclobutene (BCB).

The second display substrate 200 may be disposed above the thin-film encapsulation structure 195 to face it. The second substrate 210 of the second display substrate 200 may include a transparent material. The second substrate 210 may include a transparent insulating material, such as glass and quartz. The second substrate 210 may be a rigid substrate. However, the second substrate 210 is not limited to those described above. The second substrate 210 may include a plastic, such as polyimide, or may be flexible so that it can be curved, bent, folded, or rolled.

The second substrate 210 may be of the same type as the first substrate 110 or may have different material, thickness, transmittance, etc. For example, the second substrate 210 may have a higher transmittance than the first substrate 110. The second substrate 210 may be either thicker or thinner than the first substrate 110.

A light-blocking member BM may be disposed along the boundaries of the pixels PX on a surface of the second substrate 210 which faces the first substrate 110. The light-blocking member BM may overlap the pixel-defining layer 185 of the first display substrate 100 and may be disposed in the non-emission area NEM. The light-blocking member BM may include an opening exposing a surface of the second substrate 210 overlapping the emission area EMA. The light-blocking member BM may be formed in a grid shape when viewed in a plan view.

The light-blocking member BM may include an organic material. The light-blocking member BM can absorb external light, thereby reducing color distortion due to reflection of external light. In addition, the light-blocking member BM can prevent light emitted from the light-emitting layer 190 from intruding into adjacent pixels PX.

According to an embodiment, the light-blocking member BM can absorb all visible wavelengths. The light-blocking member BM may include a light-absorbing material. For example, the light-blocking member BM may be made of a material used as a black matrix of the display device 1.

According to another embodiment, the light-blocking member BM may absorb light in a particular wavelength range among the visible light wavelengths and may transmit light in other wavelength ranges. For example, the light-blocking member BM may include the same material as one of color filter layers CFL. Specifically, the light-blocking member BM may be made of the same material as a blue color filter layer CFL3. In some embodiments, the light-blocking member BM may be formed integrally with the blue color filter layer. In some implementations, the light-blocking member BM may be eliminated.

The color filter layers CFL may be disposed on a surface of the second substrate 210 on which the light-blocking member BM is disposed. The color filter layers CFL may be disposed on the surface of the second substrate 210 exposed through the opening of the light-blocking member BM. Furthermore, the color filter layers CFL may be partially disposed on the adjacent light-blocking member BM.

The color filter layers CFL may include a first color filter layer CFL1 disposed in the first color pixel PX, a second color filter layer CFL2 disposed in the second color pixel PX, and a third color filter layer CFL3 disposed in the third color pixel PX. Each of the color filter layers CFL may include a colorant, such as a dye and a pigment, which absorbs wavelengths other than the wavelength of the color it represents. The first color filter layer CFL1 may be a red color filter layer, the second color filter layer CFL2 may be a green color filter layer, and the third color filter layer CFL3 may be a blue color filter layer. Although the adjacent color filters CFL are spaced apart from one another on the light-blocking member BM in the example shown in the drawings, the inventive concepts are not limited thereto. The adjacent color filter layers CFL may partially overlap one another on the light-blocking member BM.

A first capping layer 220 may be disposed on the color filter layers CFL. The first capping layer 220 can prevent impurities, such as moisture and air, from permeating from the outside to damage or contaminate the color filter layer CFL. In addition, the first capping layer 220 can prevent the colorant of the color filter layer CFL from being diffused into other elements.

The first capping layer 220 may be in direct contact with a surface (lower surface in FIG. 2) of the color filter layers CFL. The first capping layer 220 may be made of an inorganic material. For example, the first capping layer 220 may be made of a material including silicon nitride, aluminum nitride, zirconium nitride, titanium nitride, hafnium nitride, tantalum nitride, silicon oxide, aluminum oxide, titanium oxide, tin oxide, silicon oxynitride, etc.

Partition walls PTL may be disposed on the first capping layer 220. The partition walls PTL may be disposed in the non-emission area NEM. The partition walls PTL may be disposed so that they overlap the light-blocking member BM. The partition walls PTL may include openings via which the color filter layers CFL are exposed. The partition walls PTL may include, but is not limited to, a photosensitive organic material. The partition walls PTL may further include a light-blocking material.

A wavelength conversion layer WCL and/or a transparent layer TPL may be disposed in the space exposed by the openings of the partition walls PTL. The wavelength conversion layer WCL and the transparent layer TPL may be formed by, but is not limited to, an inkjet process using the partition walls PTL as a bank.

According to an embodiment where the light-emitting layer 190 of each of the pixels PX emitting light of a third color, the wavelength conversion layer WCL may include a first wavelength conversion pattern WCL1 disposed in the first color pixel PX, and a second wavelength conversion pattern WCL2 disposed in the second color pixel PX. The transparent layer TPL may be disposed in the third color pixel PX.

The first wavelength conversion pattern WCL1 may include a first base resin BRS1, and first wavelength-converting particles WCP1 dispersed in the first base resin BRS1. The second wavelength conversion pattern WCL2 may include a second base resin BRS2 and second wavelength-converting particles WCP2 dispersed in the second base resin BRS2. The transparent layer TPL may include a third base resin BRS3 and scatterers SCP dispersed therein.

The first to third base resins BRS1, BRS2 and BRS3 may include a transparent organic material. For example, the first to third base resins BRS1, BRS2 and BRS3 may include an epoxy resin, an acrylic resin, a cardo resin, an imide resin, or the like. The first to third base resins BRS1, BRS2 and BRS3 may be made of, but is not limited to, the same material.

The scattering particles SCP may be metal oxide particles or organic particles. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), etc. Examples of the material of the organic particles may include an acrylic resin, a urethane resin, etc.

The first wavelength-converting particles WCP1 may convert the third color into the first color, and the second wavelength-converting particles WCP2 may convert the third color into the second color. The first wavelength-converting particles WCP1 and the second wavelength-converting particles WCP2 may be quantum dots, quantum rods, phosphors, etc. The quantum dots may include IV nanocrystals, II-VI compound nanocrystals, III-V compound nanocrystals, IV-VI nanocrystals, or combinations thereof. The first wavelength conversion pattern WCL1 and the second wavelength conversion pattern WCL2 may further include scattering particles SCP that increase wavelength conversion efficiency.

The transparent layer TPL disposed in the third color pixel PX transmits the light of the third color incident from the light-emitting layer 190 without changing the wavelength. The scattering particles SCP of the transparent layer TPL may adjust an emission path of exiting light through the transparent layer TPL. The transparent layer TPL may include no wavelength conversion material.

A second capping layer 230 is disposed on the wavelength conversion layer WCL, the transparent layer TPL and the partition walls PTL. The second capping layer 230 may be made of an inorganic material. The second capping layer 230 may include a material selected from among the materials listed above as materials of the first capping layer 220. The second capping layer 230 and the first capping layer 220 may be made of, but is not limited to, the same material.

The filling layer 300 may be interposed between the first display substrate 100 and the second display substrate 200. The space between the first display substrate 100 and the second display substrate 200 may be filled with the filling layer 300, and they may be attached and coupled with each other by the filling layer 300. The filling layer 300 may be disposed between the thin-film encapsulation structure 195 of the first display substrate 100 and the second capping layer 230 of the second display substrate 200. The filling layer 300 may be made of, but is not limited to, a Si-based organic material, an epoxy-based organic material, etc.

Hereinafter, the circuit layer CCL of the above-described display device 1 will be described in detail.

Figure 3:
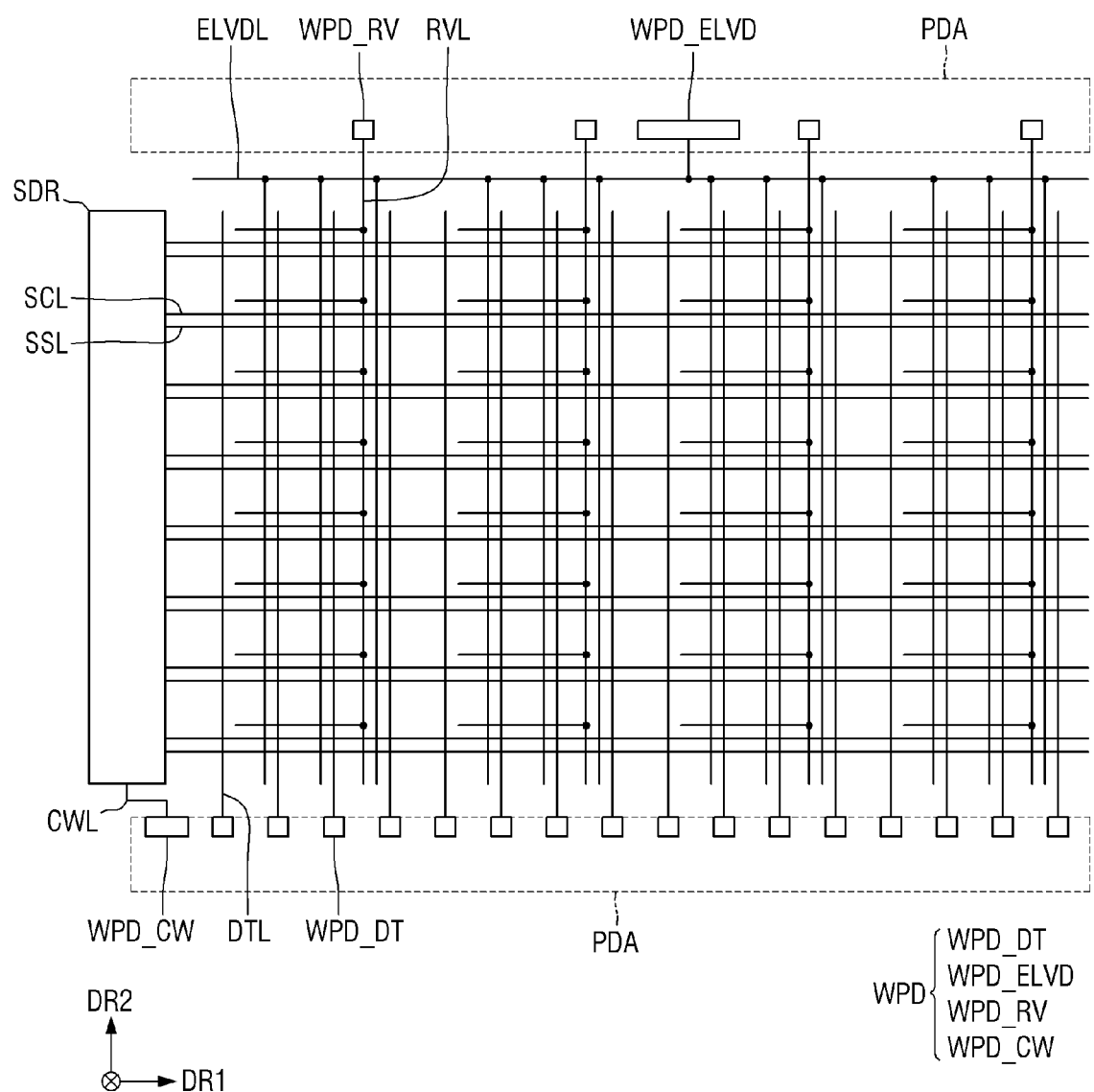
FIG. 3 is a view showing a layout of a circuit layer of a first display substrate of a display device according to an embodiment of the present invention.

FIG. 3 is a view showing a layout of a circuit layer CCL of a first display substrate 100 of a display device 1 according to an embodiment of the present invention.

Referring to FIG. 3, a plurality of lines is disposed on the first substrate 110. The plurality of lines may include a scan line SCL, a sensing signal line SSL, a data line DTL, a reference voltage line RVL, a first supply voltage line ELVDL, etc.

The scan line SCL and the sensing signal line SSL may be extended in the first direction DR1. The scan line SCL and the sensing signal line SSL may be connected to the scan driver SDR. The scan driver SDR may include a driving circuit formed of the circuit layer CCL. The scan driver SDR may be disposed in the third non-display area NDA on the first substrate 110, but the inventive concepts are not limited thereto. The scan driver SDR may be disposed in a fourth non-display area NDA or in both the third non-display area NDA and the fourth non-display area NDA. The scan driver SDR may be connected to a signal connection line CWL. At least one end of the signal connection line CWL may form a pad WPD_CW on the first non-display area NDA and/or the second non-display area NDA and may be connected to an external device EXD (see FIG. 1).

The data line DTL and the reference voltage line RVL may be extended in the second direction DR2 crossing the first direction DR1. A first supply voltage line ELVDL may include a portion extending in the second direction DR2. The first supply voltage line ELVDL may further include a portion extending in the first direction DR1. The first supply voltage line ELVDL may have, but is not limited to, a mesh structure.

The wire pads WPD may be disposed at at least one end of the data line DTL, the reference voltage line RVL, and the first supply voltage line ELVDL. Each of the wire pads WPD may be disposed in the pad area PDA of the non-display area NDA. According to an embodiment, a wire pad WPD_DT of the data line DTL (hereinafter, referred to as a data pad) may be disposed in the pad area PDA of the non-display area NDA. A wire pad WPD_RV of the reference voltage line RVL (hereinafter referred to as a reference voltage pad) and a wire pad WPD_ELVD of the first supply voltage line ELVDL (hereinafter referred to as a first supply voltage pad) may be disposed in the pad area PDA of the second non-display area NDA. As another example, the data pad WPD_DT, the reference voltage pad WPD_RV and the first supply voltage pad WPD_ELVD may all be disposed in the same area, e.g., the first non-display area NDA. As described above, the external device EXD (see FIG. 1) may be mounted on the wire pad WPD. The external device EXD may be mounted on the wire pad WPD by an anisotropic conductive film, ultrasonic bonding, etc.

Each of the pixels PX on the first substrate 110 includes a pixel driving circuit. The above-described lines may pass through each of the pixels PX or the periphery thereof to apply a driving signal to the pixel driving circuit. The pixel driving circuit may include a transistor and a capacitor. The numbers of transistors and capacitors of each pixel driving circuit may be changed in a variety of ways. In the following description, the pixel driving circuit having a 3T1C structure including three transistors and one capacitor will be described as an example. It is, however, to be understood that the inventive concepts are not limited thereto. A variety of modified pixel structure may be employed such as a 2T1C structure, a 7T1C structure, and a 6T1C structure.

Figure 4:
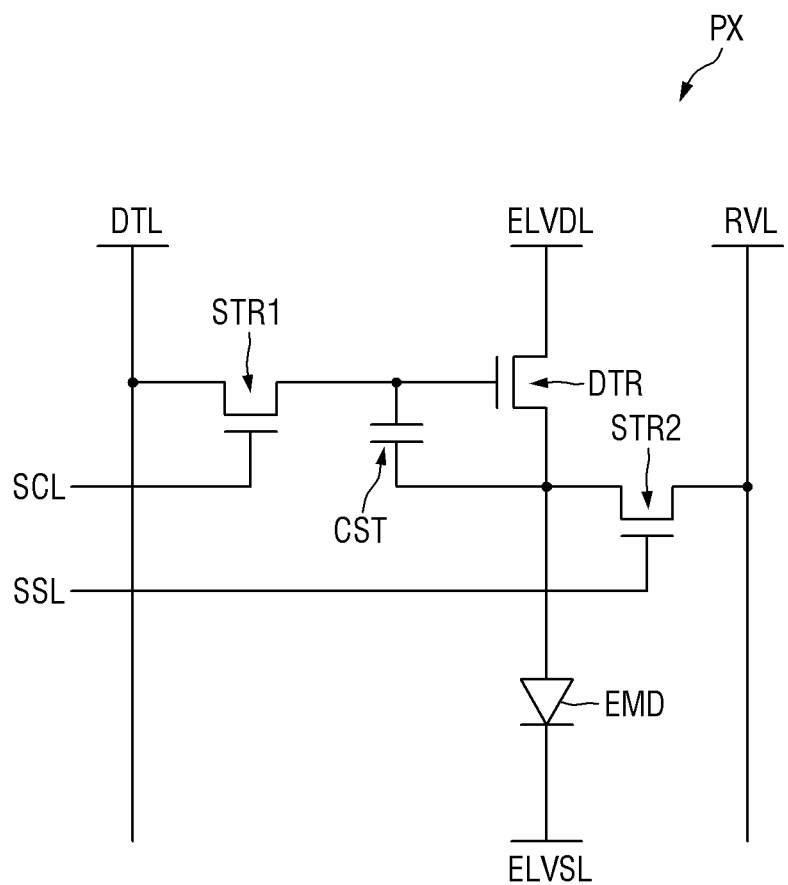
FIG. 4 is an equivalent circuit diagram of a pixel of a display device according to an embodiment of the present invention.

FIG. 4 is an equivalent circuit diagram of a pixel of a display device according to an embodiment of the present invention.

Referring to FIG. 4, each of the pixels PX of the display device according to the embodiment includes three transistors DTR, STR1, and STR2 and one capacitor for storage CST in addition to a light-emitting diode EMD.

The light-emitting diode EMD emits light in proportional to the current supplied through the driving transistor DTR. The light-emitting diode EMD may be implemented as an organic light-emitting diode, a micro light-emitting diode, a nano light-emitting diode, etc.

The first electrode (i.e., the anode electrode) of the light-emitting diode EMD may be connected to the source electrode of the driving transistor DTR, and the second electrode (i.e., the cathode electrode) thereof may be connected to a second supply voltage line ELVSL, from which a low-level voltage (second supply voltage) is applied, lower than a high-level voltage (first supply voltage) of a first supply voltage line ELVDL.

The driving transistor DTR adjusts a current flowing from the first supply voltage line ELVDL from which the first supply voltage is applied to the light-emitting diode EMD according to the voltage difference between the gate electrode and the source electrode. The gate electrode of the driving transistor DTR may be connected to a source/drain electrode of the first switching transistor STR1, the source electrode may be connected to a first electrode of the light-emitting diode EMD, and the drain electrode may be connected to the first supply voltage line ELVDL from which the first supply voltage is applied.

The first switching transistor STR1 is turned on by a scan signal of a scan line SCL to connect a data line DTL with the gate electrode of the driving transistor DTR. A gate electrode of the first switching transistor STR1 may be connected to the scan line SCL, the first source/drain electrode may be connected to the gate electrode of the driving transistor DTR1, and a second source/drain electrode thereof may be connected to the data line DTL.

The second switching transistor STR2 may be turned on by a sensing signal of a sensing signal line SSL to connect a reference voltage line RVL to the source electrode of the driving transistor DTR. A gate electrode of the second switching transistor ST2 may be connected to the sensing signal line SSL, the first source/drain electrode thereof may be connected to the reference voltage line RVL, and the second source/drain electrode thereof may be connected to the source electrode of the driving transistor DTR.

According to an embodiment, the first source/drain electrode of each of the first and second switching transistors STR1 and STR2 may be a source electrode while the second source/drain electrode thereof may be a drain electrode. It is, however, to be understood that the inventive concepts are not limited thereto. The first source/drain electrode of each of the first and second switching transistors STR1 and STR2 may be a drain electrode while the second source/drain electrode thereof may be a source electrode.

A storage capacitor CST may be formed between the gate electrode and the source electrode of the driving transistor DTR. The storage capacitor CST stores a voltage difference between the gate voltage and the source voltage of the driving transistor DTR.

The driving transistor DTR and the first and second switching transistors STR1 and STR2 may be formed as thin-film transistors. In addition, although FIG. 3 shows that each of the driving transistor DTR and the first and second switching transistors STR1 and STR2 is implemented as an n-type MOSFET (metal oxide semiconductor field effect transistor), it is to be noted that the inventive concepts are not limited thereto. That is to say, the driving transistor DTR and the first and second switching transistors STR1 and STR2 may be implemented as p-type MOSFETs, or some of them may be implemented as n-type MOSFETs while the others may be implemented as p-type MOSFETs.

Figure 5:
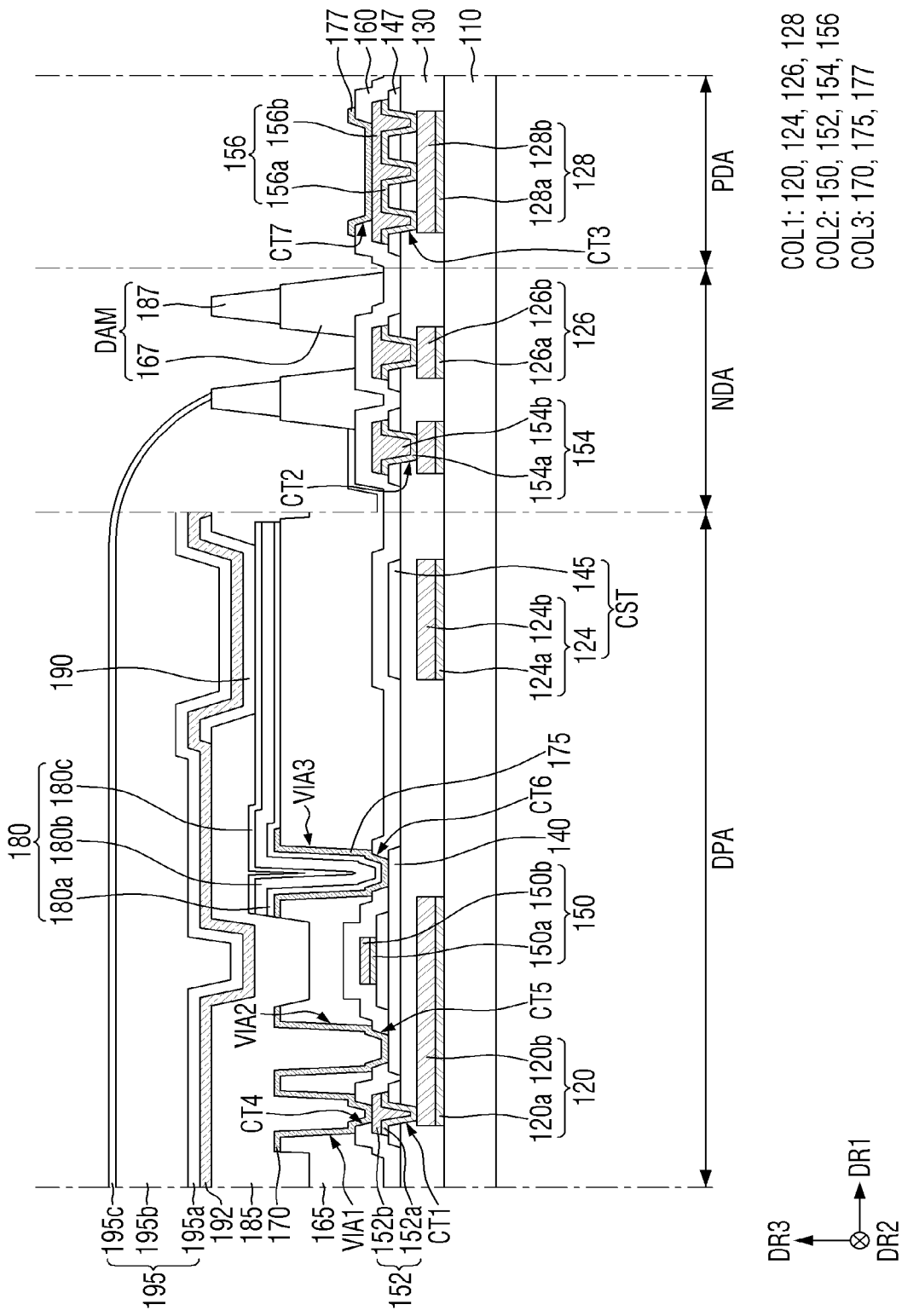
FIG. 5 is a cross-sectional view of a first display substrate of a display device according to an embodiment of the present invention.

FIG. 5 is a cross-sectional view of a first display substrate of a display device according to an embodiment. FIG. 5 shows parts of the display area DPA, the non-display area NDA, and the pad area PDA. In the cross-sectional view, a transistor and a capacitor of a pixel are depicted in the display area DPA, a dam is depicted in the non-display area NDA, and a gate pad is depicted in the pad area PDA. In addition, FIG. 5 mainly shows the circuit layer CCL of the first display substrate 100 and shows up to a thin-film encapsulation structure 195 of the stack structure.

Referring to FIG. 5, the circuit layer CCL includes a semiconductor layer 140, a plurality of conductive layers and a plurality of insulating layers disposed on the first substrate 110. The semiconductor layer 140 may include an oxide semiconductor. The plurality of conductive layers may include a light-blocking layer 120, a lower pattern layer 126, a lower capacitor 124, a lower pad electrode 128, an upper capacitor 145, a connection pattern layer 152, a gate electrode 150, first and second bridge layers 170 and 175, a pixel electrode 180, and a common electrode 192. The plurality of insulating layers may include a buffer layer 130, a gate insulating layer 147, an interlayer dielectric layer 160, a via layer 165 and a pixel-defining layer 184.

Specifically, a first conductive layer COL1 may be disposed on the first substrate 110. The first conductive layer COL1 may include the light-blocking layer 120, the lower capacitor 124, the lower pattern layer 126, and the lower pad electrode 128.

The light-blocking layer 120 and the lower capacitor 124 may be disposed such that it overlaps the display area DPA of the first substrate 110. The light-blocking layer 120 can protect the semiconductor layer 140 from external light. The light-blocking layer 120 has a patterned shape. The light-blocking layer 120 may be disposed to cover at least a channel region of the semiconductor layer 140 above it, and may also be disposed to cover the entire semiconductor layer 140. The light-blocking layer 120 may be electrically connected to the semiconductor layer 140 to suppress a change in the voltage of the transistor.

The lower capacitor 124 may be disposed between the sensing signal line SSL and the light-blocking layer 120. The lower capacitor 124 may work as the storage capacitor CST together with the upper capacitor 145 to store a voltage equal to the difference between the gate voltage and the source voltage of the transistor.

The plurality of lower pattern layers 126 may be disposed such that it overlaps the non-display area NDA of the first substrate 110. The plurality of lower pattern layers 126 may form a step for forming a dam DAM in the non-display area NDA or may work as signal lines through which signals are transmitted. For example, the plurality of lower pattern layers 126 may work as data lines for transmitting data signals among signals.

The lower pad electrode 128 may be disposed such that it overlaps the pad area PDA of the first substrate 110. The lower pad electrode 128 may be a gate pad electrode or a data pad electrode.

The first conductive layer COL1 may include a lower layer adjacent to the first substrate 110 and an upper layer disposed on the lower layer. The lower layer can assist in film formation, such as adhesion of the upper layer, or it can prevent a reactive material from entering from the first substrate 110. In addition, the lower layer can prevent the material of the upper layer from diffusing into the adjacent lower layer. The upper layer is used mainly to transmit a signal and may be made of a low-resistance material. The upper layer may be thicker than the lower layer and may be made of a material having a lower resistance than that of the lower layer.

The first conductive layer COL1 may include a conductive material. The first conductive layer COL1 may include a metal oxide such as ITO, IZO, ITZO, and $In_2O_3$, or a metal such as copper (Cu), titanium (Ti), aluminum (Al), molybdenum (Mo), tantalum (Ta), calcium (Ca), chromium (Cr), magnesium (Mg), and nickel (Ni). For example, the first conductive layer COL1 may be made up of, but is not limited to, a double layer of Cu/Ti in which an upper layer of copper is stacked on a lower layer of titanium.

Accordingly, the light-blocking layer 120 may have a double-layer structure of a first light-blocking layer 120a and a second light-blocking layer 120a disposed on the first light-blocking layer 120a. The lower capacitor 124 may have a double-layer structure of a first capacitor layer 124a and a second capacitor layer 124b disposed on the first capacitor layer 124a. The lower pattern layer 126 may have a double-layer structure of a lower first pattern layer 126a and a lower second pattern layer 126b disposed on the lower first pattern layer 126a. The lower pattern layer 128 may have a double-layer structure of a first lower pad layer 128a and a second lower pad layer 128b disposed on the first lower pad layer 128a.

The buffer layer 130 may be disposed on the first conductive layer COL1. The buffer layer 130 may be disposed to cover the entire surface of the first substrate 110 on which the light-blocking layer 120, the lower pattern layer 126, the lower capacitor 124, and the lower pad electrode 128 are formed. The buffer layer 130 image silicon nitride, silicon oxide, silicon oxynitride, etc., and may be made up of a single layer or a double layer thereof.

The semiconductor layer 140 and the upper capacitor 145 may be disposed on the buffer layer 130. The semiconductor layer 140 may be disposed to overlap the light-blocking layer 120 of the display area DPA, and the upper capacitor 145 may be disposed to overlap the lower capacitor 124 of the display area DPA. The semiconductor layer 140 may form the channel of the transistor. The upper capacitor 145 may form the storage capacitor CST together with the lower capacitor 124.

The semiconductor layer 140 and the upper capacitor 145 may include an oxide semiconductor. The oxide semiconductor may include, for example, a binary compound ($AB_x$), a ternary compound ($AB_xC_y$) and a quaternary compound ($AB_xC_yD_z$) containing indium, zinc, gallium, tin, titanium, aluminum, hafnium (Hf), zirconium (Zr), magnesium (Mg), etc. According to an embodiment, the semiconductor layer 140 and the upper capacitor 145 may include indium tin zinc oxide (IGZO). The semiconductor layer 140 and the upper capacitor 145 may become conductive so that the oxide semiconductor can have conductivity. The semiconductor layer 140 may include a channel as it is made conductive.

The gate insulating layer 147 may be disposed on the semiconductor layer 140 and the buffer layer 130. The gate insulating layer 147 may be formed in the same pattern as a second conductive layer 130 to be described later. The side surfaces of the gate insulating layer 147 may be disposed to protrude from the side surfaces of the second conductive layer COL2, but the inventive concepts are not limited thereto. The side surfaces of the gate insulating layer 147 may be substantially aligned with the side surfaces of the second conductive layer COL2.

The gate insulator 147 may include a silicon compound, a metal oxide, etc. For example, the gate insulator 147 may include silicon oxide, silicon nitride, silicon oxynitride, aluminum oxide, tantalum oxide, hafnium oxide, zirconium oxide, titanium oxide, etc. According to an embodiment, the gate insulating layer 147 may include silicon oxide.

The second conductive layer COL2 may be disposed on the gate insulating layer 147. The second conductive layer COL2 may include the connection pattern layer 152, the gate electrode 150, an upper pattern layer 154, and an upper pad electrode 156.

Specifically, the gate electrode 150 may overlap the display area DPA and may overlap the semiconductor layer 140 thereunder. The gate electrode 150 may form the transistor together with the semiconductor layer 140. The side surfaces of the gate insulating layer 147 disposed between the gate electrode 150 and the semiconductor layer 140 may protrude from the side surfaces of the gate electrode 150, but the inventive concepts are not limited thereto.

The connection pattern layer 152 may overlap the light-blocking layer 120 and may be electrically connected to the light-blocking layer 120. For example, the connection pattern layer 152 may be connected to the light-blocking layer 120 through a first contact hole CT1 formed in the buffer layer 130 to be electrically connected to the light-blocking layer 120. The side surfaces of the gate insulating layer 147 disposed between the connection pattern layer 152 and the buffer layer 130 may protrude from the side surfaces of the connection pattern layer 152, but the inventive concepts are not limited thereto.

The upper pattern layer 154 may overlap the non-display area NDA of the first substrate 110 and overlap the lower pattern layer 126 thereunder. The upper pattern layer 154 may be electrically connected to the lower pattern layer 126. For example, the upper pattern layer 154 may be connected to the lower pattern layer 126 through a second contact hole CT2 formed in the buffer layer 130 to be electrically connected to the lower pattern layer 126. The upper pattern layer 154 and the lower pattern layer 126 may be a plurality of signal lines disposed in the non-display area NDA. In addition, the side surfaces of the gate insulating layer 147 disposed between the upper pattern layer 154 and the buffer layer 130 may protrude from the side surfaces of the upper pattern layer 154, but the inventive concepts are not limited thereto.

The upper pad electrode 156 may overlap the pad area PDA of the first substrate 110 and may overlap the pad electrode 128 therebelow. The upper pad electrode 156 may be electrically connected to the lower pad electrode 128. For example, the upper pad electrode 156 may be connected to the lower pad electrode 128 through a third contact hole CT3 formed in the buffer layer 130 to be electrically connected to the lower pad electrode 128. The side surfaces of the gate insulating layer 147 disposed between the upper pad electrode 156 and the buffer layer 130 may protrude from the side surfaces of the upper pad electrode 156, but the inventive concepts are not limited thereto.

The second conductive layer COL2 may include a lower layer adjacent to the first substrate 110 and an upper layer disposed on the lower layer. The lower layer can promote film formation, such as adhesion of the upper layer, or can prevent a reactive material from entering from the buffer layer 130 or the gate insulating layer 147 disposed thereunder. In addition, the lower layer can prevent the material of the upper layer from diffusing into the adjacent lower layer. The upper layer is used mainly to transmit a signal and may be made of a low-resistance material. The upper layer may be thicker than the lower layer and may be made of a material having a lower resistance.

The second conductive layer COL2 may include a conductive material. The second conductive layer COL2 may include a metal oxide, such as ITO, IZO, ITZO, and $In_2O_3$, or a metal such as copper (Cu), titanium (Ti), aluminum (Al), molybdenum (Mo), tantalum (Ta), calcium (Ca), chromium (Cr), magnesium (Mg), and nickel (Ni). For example, the second conductive layer COL2 may be made up of, but is not limited to, a Cu/Ti double layer in which an upper layer of copper is stacked on a lower layer of titanium.

Accordingly, the connection pattern layer 152 may have a double-layer structure of a first connection pattern layer 152a, and a second connection pattern layer 152b disposed on the first connection pattern layer 152a. The gate electrode 150 may have a double-layer structure of a first gate layer 150a, and a second gate layer 150b disposed on the first gate layer 150a. The upper pattern layer 154 may have a double-layer structure of an upper first pattern layer 154a, and an upper second pattern layer 154b disposed on the upper first pattern layer 154a. The upper pattern layer 156 may have a double-layer structure of a first upper pad layer 156a and a second upper pad layer 156b disposed on the first upper pad layer 156a.

The interlayer dielectric layer 160 may be disposed on the second conductive layer COL2. The interlayer dielectric layer 160 may include an inorganic insulating material such as silicon oxide, silicon nitride, silicon oxynitride, hafnium oxide, aluminum oxide, titanium oxide, tantalum oxide, or zinc oxide.

A fourth contact hole CT4 exposing the connection pattern layer 152, fifth and sixth contact holes CT5 and CT6 exposing both ends of the semiconductor layer 140, respectively, and a seventh contact hole CT7 exposing the upper pad electrode 156 may be formed in the interlayer dielectric layer 160. The fourth contact hole CT4 may penetrate through the interlayer dielectric layer 160 to expose the connection pattern layer 152, the fifth and sixth contact holes CT5 and CT6 may penetrate through the interlayer dielectric layer 160 to expose the semiconductor layers 140, and the seventh contact hole CT7 may penetrate the interlayer dielectric layer 160 to expose the upper pad electrode 156.

The via layer 165 and a lower dam layer 167 may be disposed on the interlayer dielectric layer 160. The via layer 165 and the lower dam layer 167 may be disposed to cover the upper surface of the interlayer dielectric layer 160. The via layer 165 may overlap the display area DPA, and the lower dam layer 167 may overlap the non-display area NDA. The via layer 165 and the lower dam layer 167 may include the same material. The lower dam layer 167 may have a closed loop shape surrounding the display area DPA when viewed from the top. There may be a plurality of lower dam layers 167, for example, two lower dam layers, but the inventive concepts are not limited thereto.

The via layer 165 and the lower dam layer 167 may include an organic insulating material, such as polyacrylate resin, epoxy resin, phenolic resin, polyamide resin, polyimide resin, unsaturated polyesters resin, polyphenylene ether resin, polyphenylene sulfide resin, and benzocyclobutene (BCB). The via layer 165 and the lower dam layer 167 may further include, but is not limited to, a photosensitive material. According to an embodiment, the via layer 165 may include polyimide.

A first via hole VIA1 exposing the fourth contact hole CT4, a second via hole VIA2 exposing the fifth contact hole CT5, and a third via hole VIA3 for exposing the contact hole CT6 may be formed in the via layer 165. The first via hole VIA1 may expose the fourth contact hole CT4, and may expose a portion of the upper surface of interlayer dielectric layer 160 around the fourth contact hole CT4. The second via hole VIA2 may expose the fifth contact hole CT5, and may expose a portion of the upper surface of interlayer dielectric layer 160 around the fifth contact hole CT5. In addition, the third via hole VIA3 may expose the sixth contact hole CT6, and may expose a portion of the upper surface of interlayer dielectric layer 160 around the sixth contact hole CT6.

A third conductive layer COL3 may be disposed on the via layer 165 and the upper pad electrode 156. The third conductive layer COL3 may include a first bridge layer 170, a second bridge layer 175, and a pad capping layer 177.

The first bridge layer 170 and the second bridge layer 175 may be disposed to overlap the display area DPA. The first bridge layer 170 may electrically connect the light-blocking layer 120 with the semiconductor layer 140 through the connection pattern layer 152. For example, one end of the first bridge layer 170 may be in direct contact with the connection pattern layer 152 through the first via hole VIA1 and the fourth contact hole CT4, and the other end thereof may be in direct contact with the semiconductor layer 140 through the second via hole VIA2 and the fifth contact hole CT5. Accordingly, the first bridge layer 170 may electrically connect the light-blocking layer 120 with the semiconductor layer 140.

The second bridge layer 175 may be in direct contact with the semiconductor layer 140 through the third via hole VIA3 and the sixth contact hole CT6. The second bridge layer 175 may electrically connect the pixel electrode 180 to be described later with the semiconductor layer 140.

The pad capping layer 177 may overlap the pad area PDA. The pad capping layer 177 may be disposed on the interlayer dielectric layer 160, and may be in direct contact with the upper pad electrode 156 through the seventh contact hole CT7. The pad capping layer 177 may cover the upper pad electrode 156 to prevent oxidation of the upper pad electrode 150.

According to this embodiment, the source/drain electrode layer may be eliminated, and instead the third conductive layer COL3, i.e., the first and second bridge layers 170 and 175 and the pad capping layer 177, may perform this role. According to an embodiment, the first bridge layer 170 may connect the semiconductor layer 140 with the light-blocking layer 120, and the second bridge layer 175 may connect the semiconductor layer 140 with the pixel electrode 180. In addition, the pad capping layer 177 may cover and protect the upper pad electrode 156. According to this embodiment, by replacing the source/drain electrode layer with the third conductive layer COL3 disposed on the via layer 165, there are advantages in that the semiconductor layer 140 can be connected to the light-blocking layer 120 simply, and that the pad electrodes can be protected.

The third conductive layer COL3 may include a metal oxide such as ITO, IZO, ITZO, or $In_2O_3$. In an embodiment, the third conductive layer COL3 may include ITO. Since the pad capping layer 177 of the third conductive layer COL3 is exposed directly to external oxygen, it may include a metal oxide to protect the upper pad electrode 156 thereunder The third conductive layer COL3 may be made up of, but is not limited to, a single layer of metal oxide. According to an embodiment, the first bridge layer 170, the second bridge layer 175, and the pad capping layer 177 may include a metal oxide, which may be converted into a polycrystalline metal oxide. In particular, the pad capping layer 177 may include a polycrystalline metal oxide so that it is possible to prevent the pad capping layer 177 from being etched by an etchant during a fabrication process to be described later.

The pixel electrode 180 may be disposed on the second bridge layer 175 and the via layer 165. The pixel electrode 180 may overlap the display area DPA and may be electrically connected to the semiconductor layer 140 of the transistor through the second bridge layer 175. For example, the pixel electrode 180 may be connected to the semiconductor layer 140 through the third via hole VIA3 and the sixth contact hole CT6. The second bridge layer 175 may be disposed between the pixel electrode 180 and the semiconductor layer 140 to electrically connect the pixel electrode 180 with the semiconductor layer 140.

The pixel electrode 180 may be implemented as a triple-layer structure in which a first pixel layer 180a, a second pixel layer 180b, and a third pixel layer 180c are stacked on one another. Specifically, the first pixel layer 180a may be in direct contact with the second bridge layer 175 and may be disposed at the bottom of the pixel electrode 180. The second pixel layer 180b may be disposed on the first pixel layer 180a and may be disposed in the middle of the pixel electrode 180. The third pixel layer 180c may be disposed on the second pixel layer 180b and may be disposed at the top of the pixel electrode 180.

According to an embodiment, the pixel electrode 180 may include the same material as the first pixel layer 180a and the third pixel layer 180c, and may include a metal oxide. The second pixel layer 180b of the pixel electrode 180 may be a reflective layer that can reflect light. The second pixel layer 180b may include aluminum having a high light reflectance. For example, the pixel electrode 180 may be implemented as, but is not limited to, a triple layer of ITO/Ag/ITO.

The pixel-defining layer 185 may be disposed on the via layer 165 and the pixel electrode 180. The pixel-defining layer 185 may be disposed to overlap the display area DPA. In addition, an upper dam layer 187 may be disposed on the lower dam layer 167 in the non-display area NDA. The upper dam layer 187 may be disposed to overlap the lower dam layer 167. The side surfaces of the upper dam layer 187 may be disposed more to the inside than the side surfaces of the lower dam layer 167, but the inventive concepts are not limited thereto. The side surfaces of the upper dam layer 187 may be aligned with the side surfaces of the lower dam layer 167. The lower dam layer 167 and the upper dam layer 187 may form a dam DAM to prevent an organic material from overflowing from the display area DPA. The pixel-defining layer 185 and the upper dam layer 187 may include the same material. The material of the pixel-defining layer 185 is identical to that described above with reference to FIG. 2 and, therefore, redundant descriptions will be omitted.

The light-emitting layer 190 may be disposed on the pixel-defining layer 185 and the pixel electrode 180. The common electrode 192 may be disposed on the light-emitting layer 190. The common electrode 192 may be disposed in the entire display area DPA of the first substrate 110. The light-emitting layer 190 and the common electrode 192 are identical to those described above with reference to FIG. 2; and, therefore, redundant descriptions will be omitted.

The thin-film encapsulation structure 195 may be disposed on the common electrode 192. The thin film encapsulation structure 195 may include a first inorganic layer 195a, an organic layer 195b, and a second inorganic layer 195c. The thin-film encapsulation structure 195 may overlap the display area DPA and the non-display area NDA. The thin-film encapsulation structure 195 may cover the entire display area DPA and a portion of the non-display area NDA. For example, at least a portion of the thin-film encapsulation structure 195 may cover at least a portion of the dam DAM. It is, however, to be understood that the inventive concepts are not limited thereto.

As described above, in the display device according to the embodiment, by replacing the source/drain electrode layer with the third conductive layer COL3 disposed on the via layer 165, there are advantages in that the semiconductor layer 140 can be connected to the light-blocking layer 120 with a simple structure, and that the pad electrodes can be protected.

Hereinafter, a method of fabricating the display device shown in FIG. 5 will be described.

FIGS. 6 to 20 are cross-sectional views showing processing steps of a method of fabricating a display device according to an embodiment of the present invention.

Figure 6:
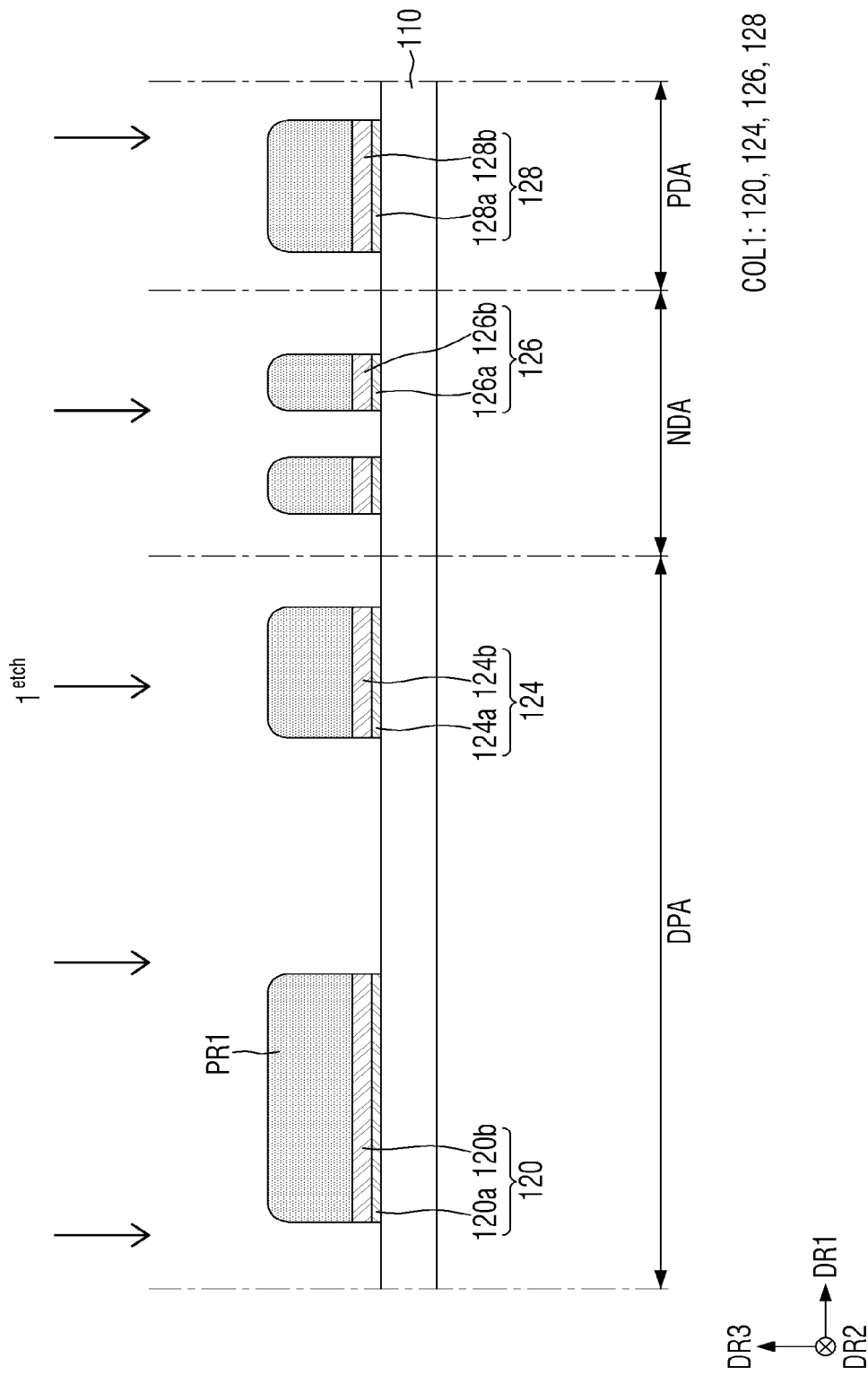
FIGS. 6, 7, 8, 9, 10, 11, 12, 13, 14, 15, 16, 17, 18, 19, and 20 are cross-sectional views showing processing steps of a method of fabricating a display device according to an embodiment of the present invention.

Referring to FIG. 6, initially, a patterned light-blocking layer 120, a lower capacitor 124, a lower pattern layer 126, and a lower pad electrode 128 are formed on a first substrate 110. The patterned light-blocking layer 120, the lower capacitor 124, the lower pattern layer 126, and the lower pad electrode 128 may be formed via a first mask process. For example, a material layer below the first conductive layer and a material layer above the first conductive layer are sequentially deposited on the first substrate 110. Subsequently, a photoresist is applied on the material layer above the first conductive layer, and a first photoresist pattern PR1 is formed by exposure and development. Subsequently, a first etching process (1etch) of ejecting an etchant using the first photoresist pattern PR1 as a mask to sequentially etch the material layer below the first conductive layer and the material layer above the first conductive layer is carried out. Subsequently, the first photoresist pattern PR1 is removed by stripping or ashing it.

Accordingly, as shown in FIG. 6, the light-blocking layer 120 in which a first light-blocking layer 120a and a second light-blocking layer 120b are stacked, a lower capacitor 124 in which a first capacitor layer 124a and a second capacitor layer 124b are stacked, a lower pattern layer 126 in which a lower first pattern layer 126a and a lower second pattern layer 126b are stacked, and a lower pad electrode 128 in which a first lower pad layer 128a and a second lower pad layer 128b are stacked, may be formed.

Figure 7:
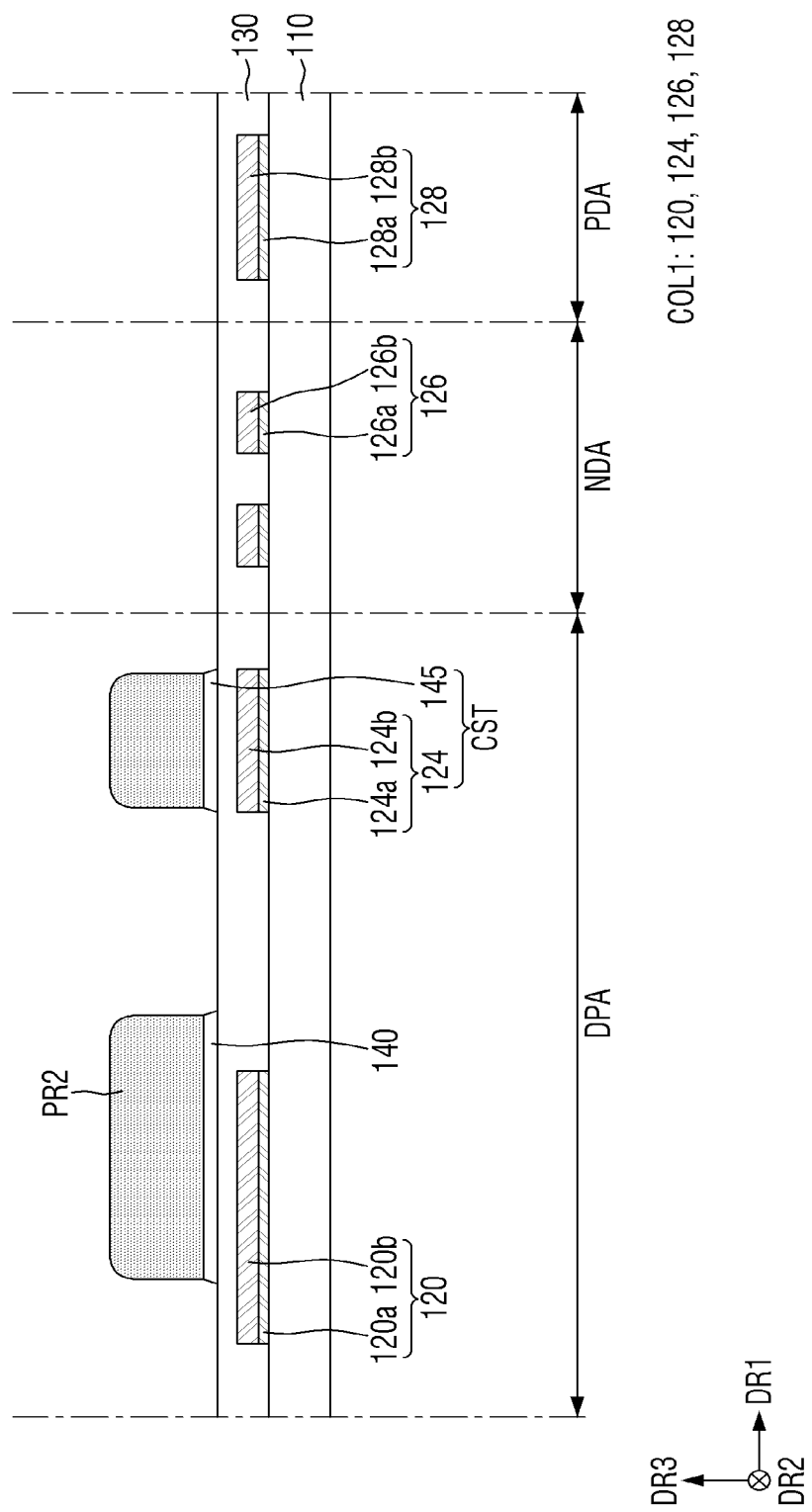

Subsequently, referring to FIG. 7, a buffer layer 130 is formed over the first substrate 110 on which the light-blocking layer 120, the lower capacitor 124, the lower pattern layer 126, and the lower pad electrode 128 are formed. Subsequently, a semiconductor layer 140 and an upper capacitor 145 are formed on the buffer layer 130. The semiconductor layer 140 and the upper capacitor 145 may be formed via a second mask process. For example, an oxide semiconductor material layer may be deposited on the buffer layer 130, and then a second photoresist pattern PR2 is formed via a photolithography process. A second etching process (2etch) of ejecting an etchant using the second photoresist pattern PR2 as a mask to etch the oxide semiconductor material layer is carried out. Subsequently, the second photoresist pattern PR2 may be stripped or ashed to form the patterned semiconductor layer 140 and the upper capacitor 145, as shown in FIG. 7.

Figure 8:
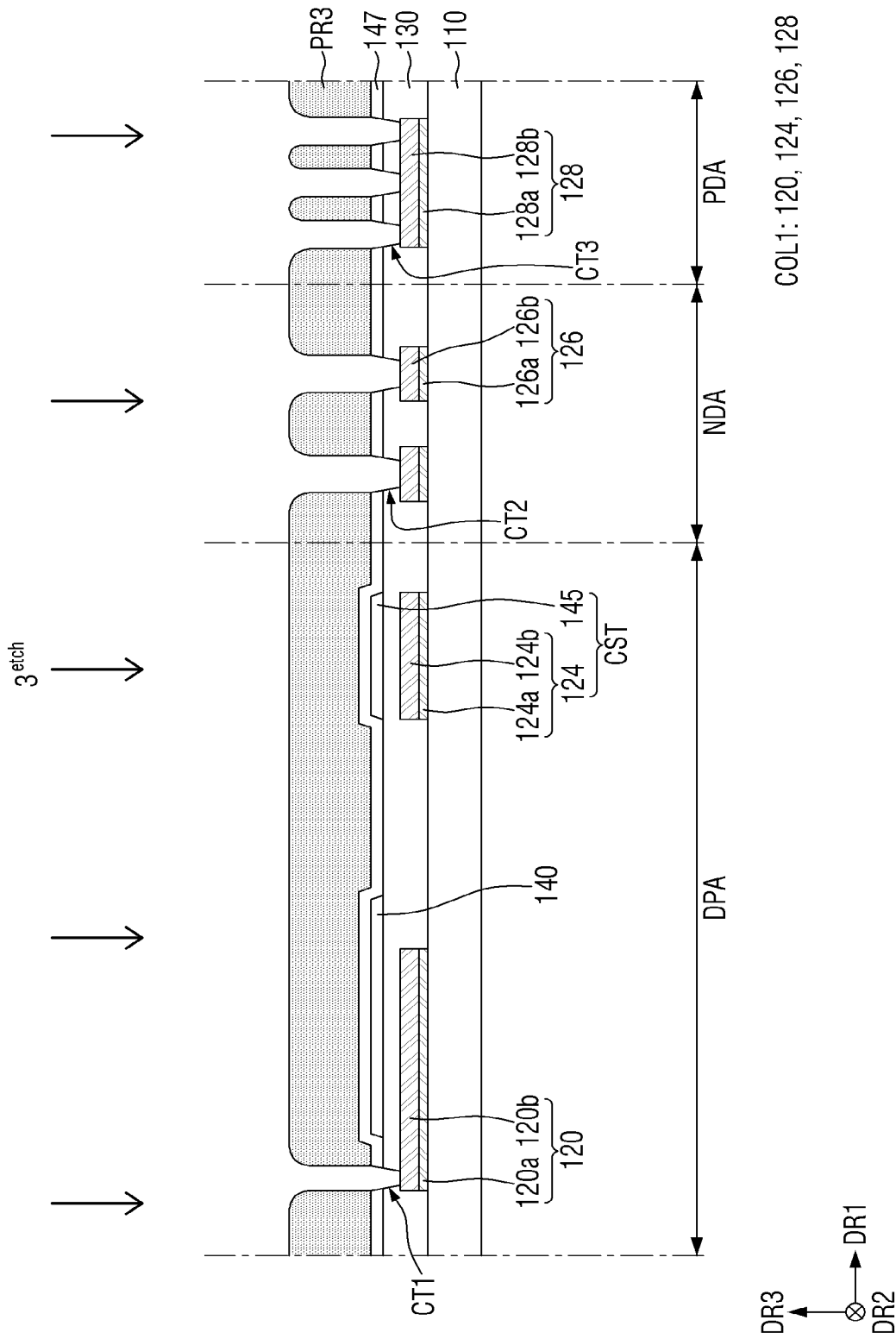

Subsequently, referring to FIG. 8, a gate insulating layer 147 is formed on the buffer layer 130 on which the semiconductor layer 140 and the upper capacitor 145 are formed. Subsequently, a first contact hole CT1, a second contact hole CT2, and a third contact hole CT3 penetrating through the gate insulating layer 147 and the buffer layer 130 are formed. The first contact hole CT1, the second contact hole CT2, and the third contact hole CT3 may be formed via a third mask process. For example, a third photoresist pattern PR3 is formed on the gate insulating layer 147 via a photolithography process. A third etching process (3etch) of ejecting an etchant using the third photoresist pattern PR3 as a mask to etch the gate insulating layer 147 and the buffer layer 130 is carried out. Subsequently, the third photoresist pattern PR3 may be stripped or ashed to form a first contact hole CT1, a second contact hole CT2, and a third contact hole CT3 as shown in FIG. 8. The first contact hole CT1 may expose the light-blocking layer 120, the second contact hole CT2 may expose the lower pattern layer 126, and the third contact hole CT3 may expose the lower pad electrode 128.

Figure 9:
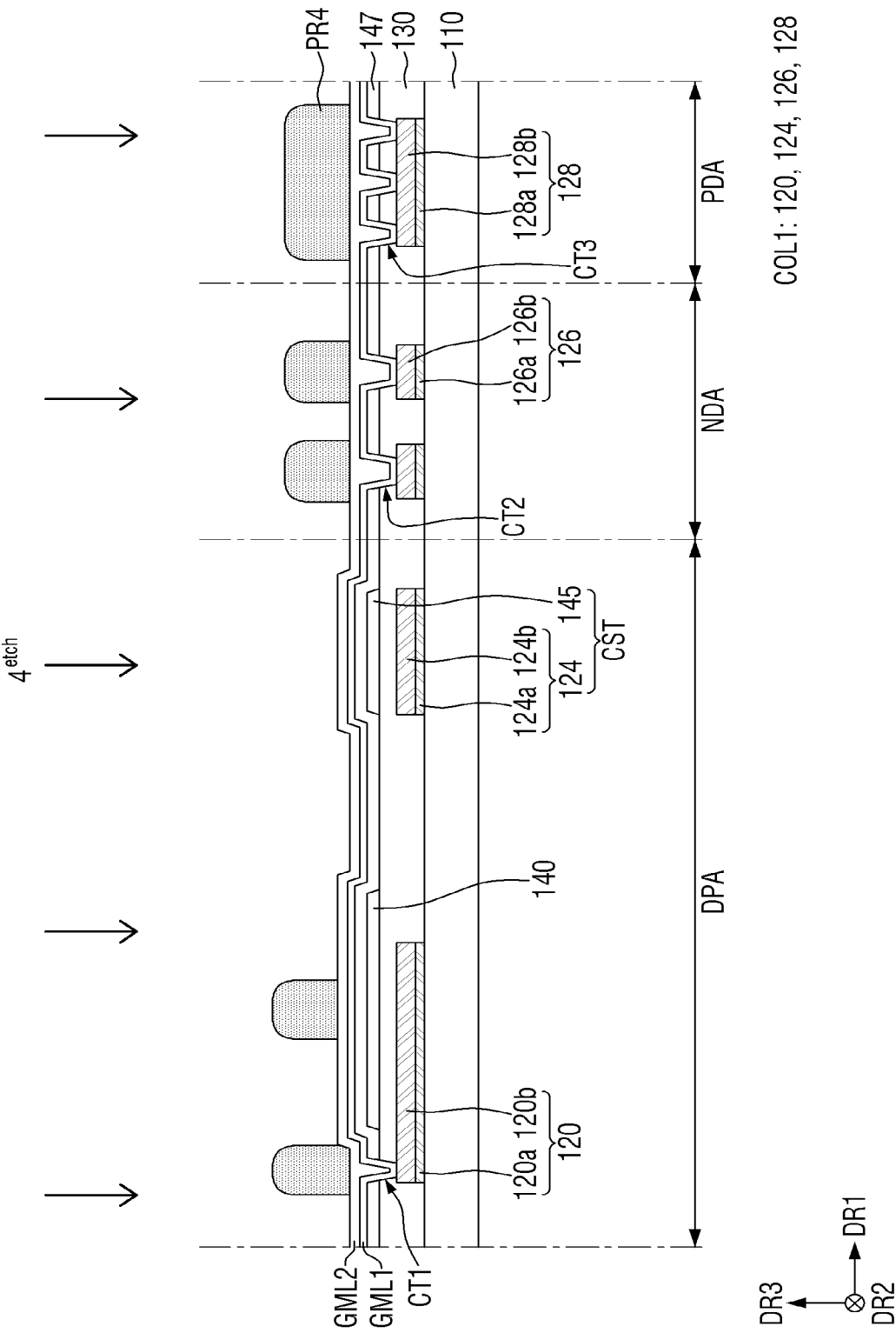

Subsequently, referring to FIGS. 9 and 10, a patterned connection pattern layer 152, a gate electrode 150, an upper pattern layer 154, and an upper pad electrode 156 are formed on the first substrate 110 in which the first contact hole CT1, the second contact hole CT2, and the third contact hole CT3 are formed. The patterned connection pattern layer 152, the gate electrode 150, the upper pattern layer 154, and the upper pad electrode 156 may be formed via a fourth mask process. For example, a first gate material layer GML1 and a second gate material layer GML2 are sequentially deposited on the first substrate 110. Subsequently, a photoresist is applied on the second gate material layer GML2, and a fourth photoresist pattern PR4 is formed by exposure and development. Subsequently, a fourth etching process (4etch) of ejecting an etchant using the fourth photoresist pattern PR4 as a mask to sequentially etch the first gate material layer GML1 and the second gate material layer GML2 is carried out.

Figure 10:
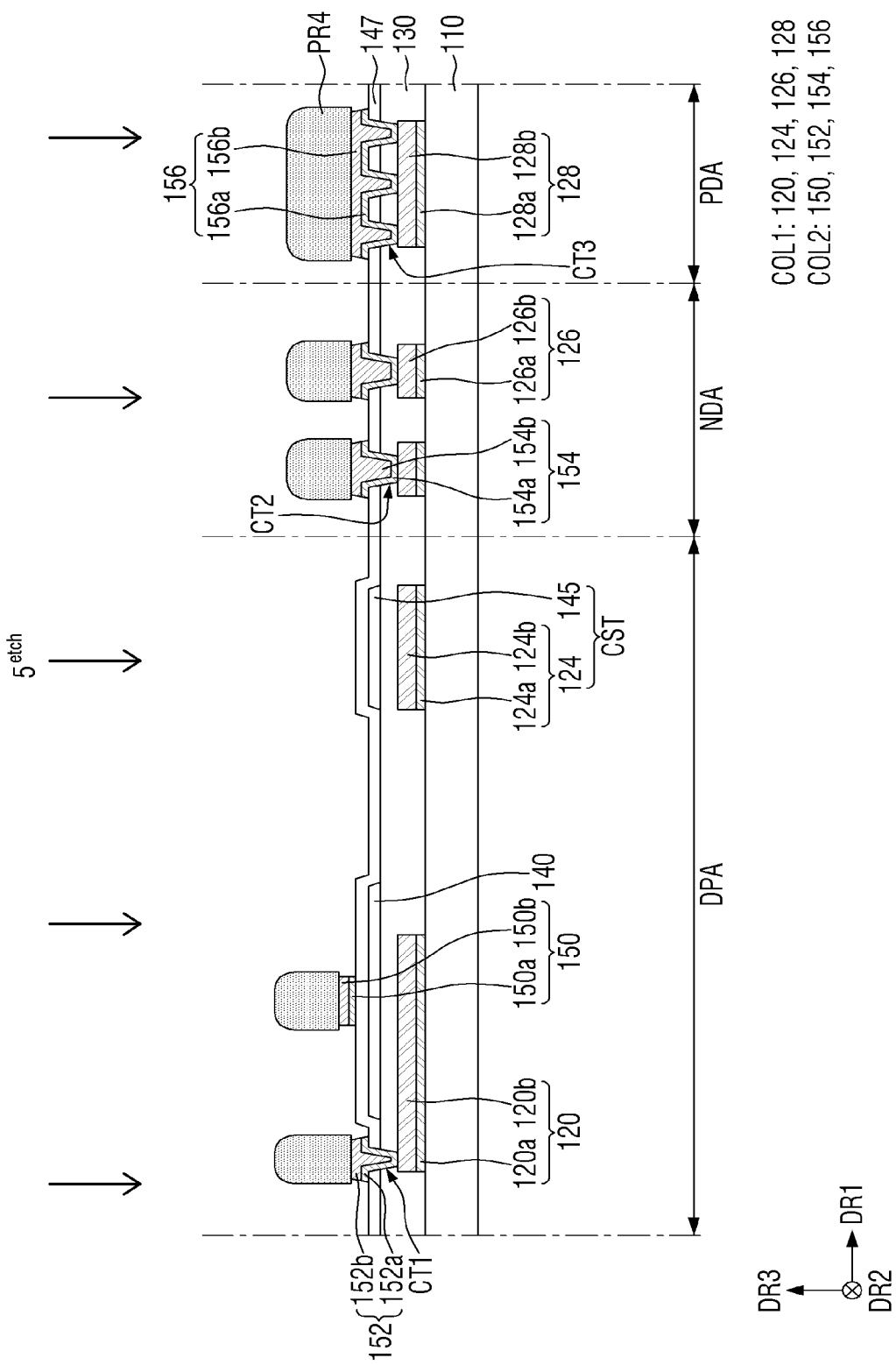

Accordingly, as shown in FIG. 10, a connection pattern layer 152 in which a first connection pattern layer 152a and a second connection pattern layer 152b are stacked, a gate electrode 150 in which a first gate layer 150a and a second gate layer 150b are stacked, an upper pattern layer 154 in which an upper first pattern layer 154a and an upper second pattern layer 154b are stacked, and an upper pad electrode 156 in which a first upper pad layer 156a and a second upper pad layer 156b are stacked, may be formed.

The connection pattern layer 152 may be connected to the light-blocking layer 120 via the first contact hole CT1, the upper pattern layer 154 may be connected to the lower pattern layer 126 via the second contact hole CT2, and the upper pad electrode 156 may be connected to the lower pad electrode 128 via the third contact hole CT3.

Subsequently, a patterned gate insulating layer 147 is formed. The patterned gate insulating layer 147 may be formed using the remaining fourth photoresist pattern PR4 as a mask. For example, a fifth etching process (5etch) of ejecting an etchant using the fourth photoresist pattern PR4 as a mask to etch the gate insulating layer 147 is carried out.

Figure 11:
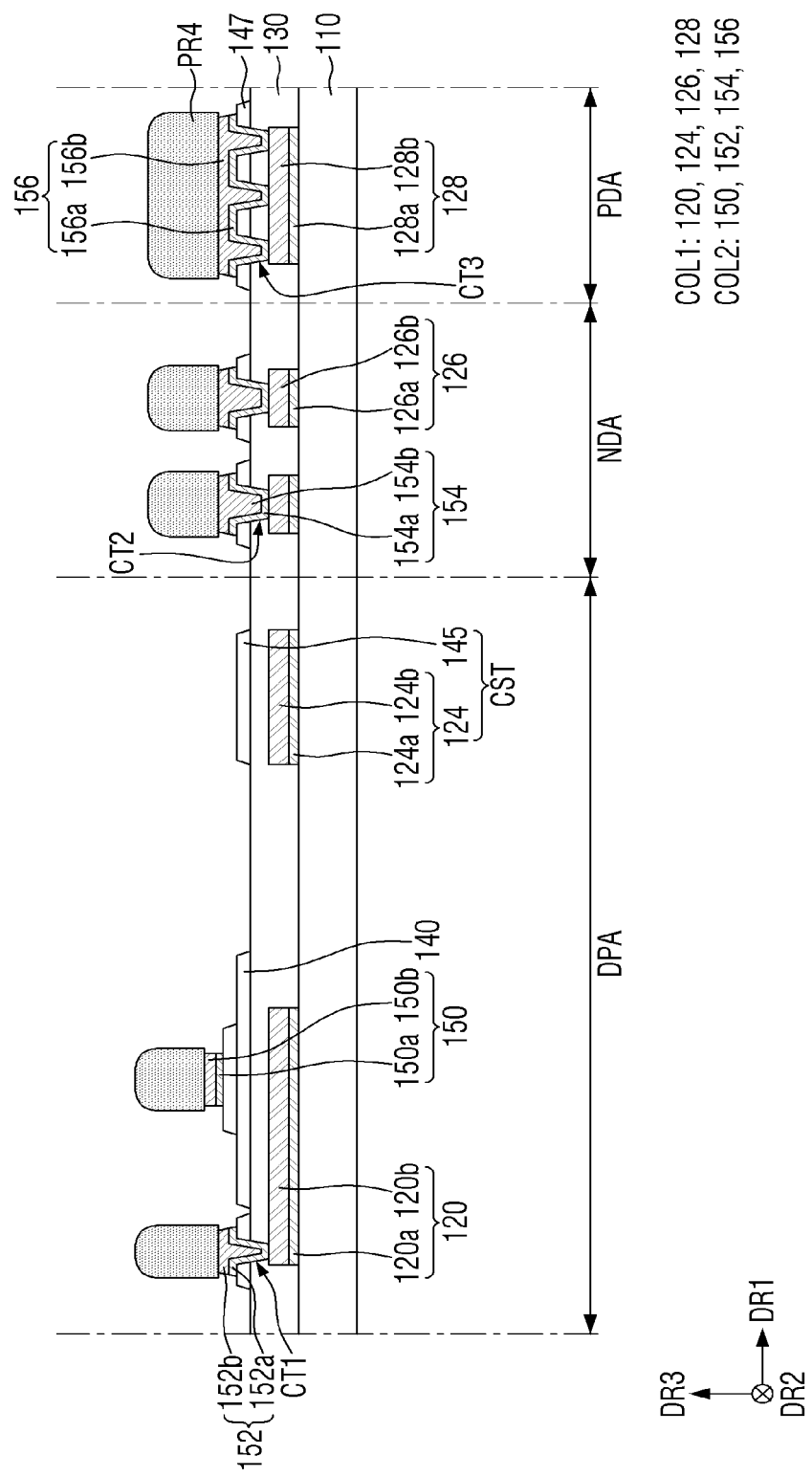

Accordingly, as shown in FIG. 11, the gate insulating layer 147 may be etched and patterned by the fifth etching process (5etch). Subsequently, the fourth photoresist pattern PR4 is removed by stripping or ashing it.

Subsequently, referring to FIGS. 12 to 16, an interlayer dielectric layer 160 and a via layer 165 are formed over the connection pattern layer 152, the gate electrode 150, the upper pattern layer 154 and the upper pad electrode 156 formed on the first substrate 110. The interlayer dielectric layer 160 and the via layer 165 may be formed via a fifth mask process.

Figure 12:
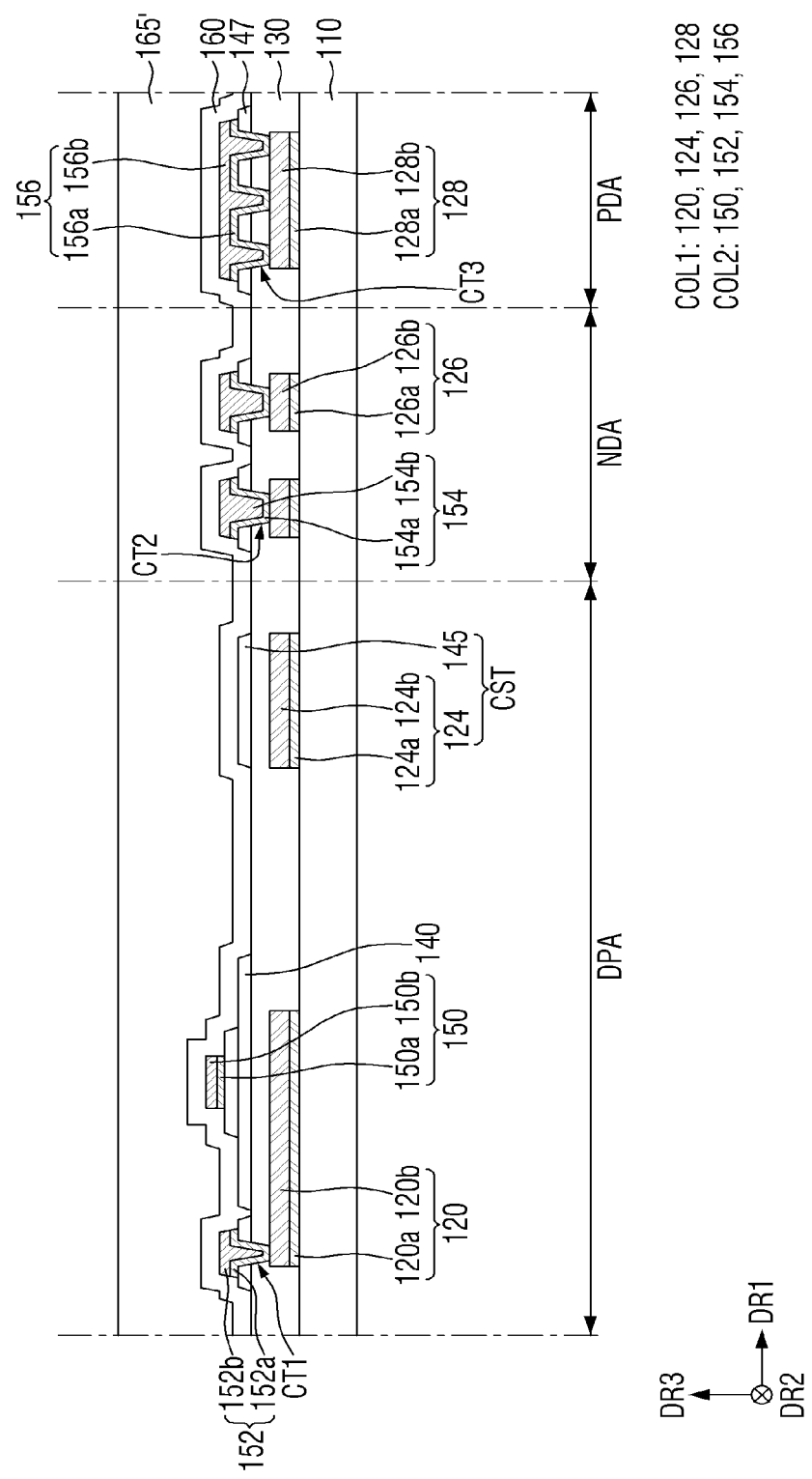

Specifically, referring to FIG. 12, the interlayer dielectric layer 160 is formed on the first substrate 110, and a first via material layer 165' is formed on the interlayer dielectric layer 160.

Figure 13:
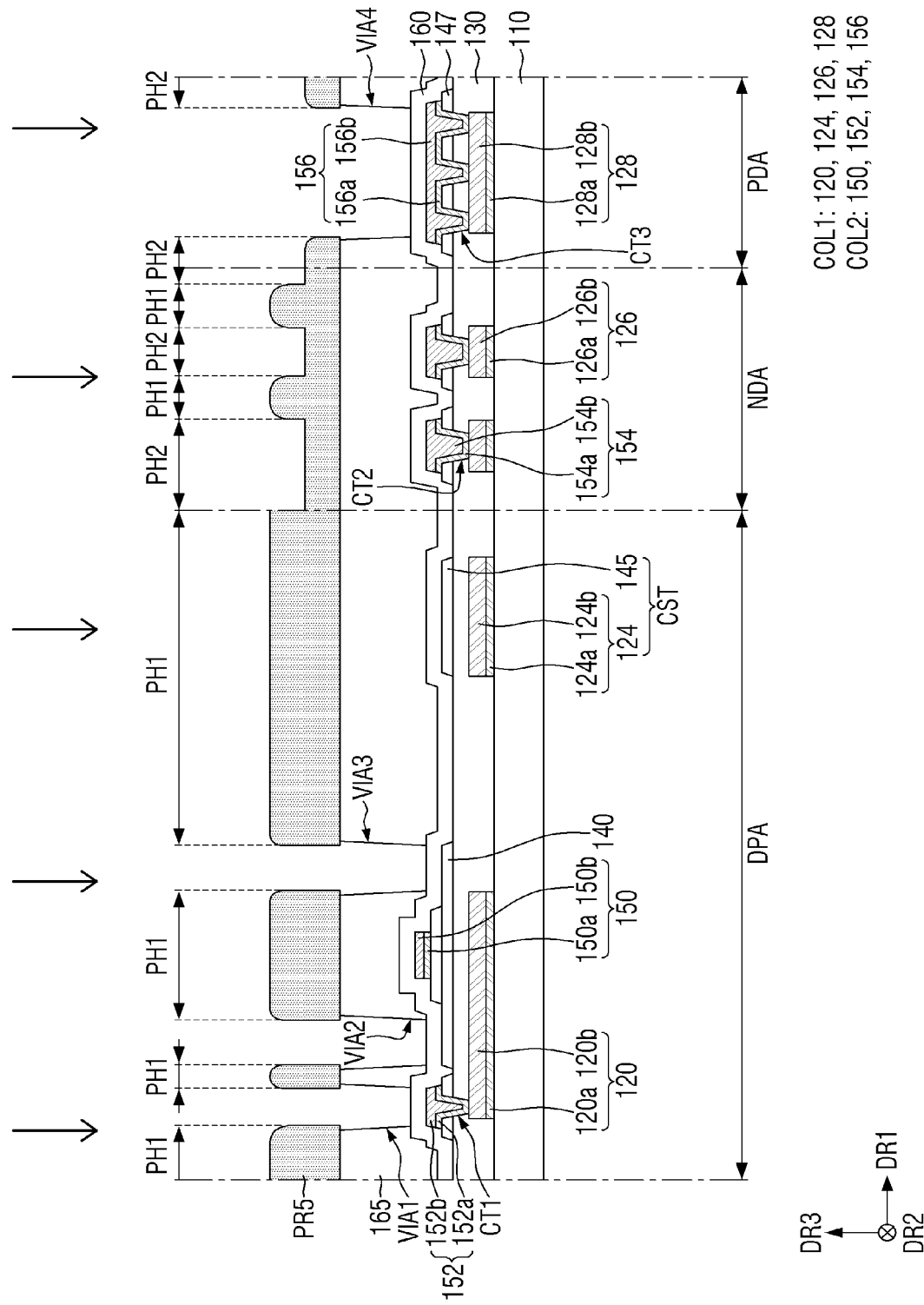

Subsequently, referring to FIG. 13, a fifth photoresist pattern PR5 is formed on the first via material layer 165' via a photolithography process using the fifth mask. The fifth mask may be a half-tone mask. The fifth photoresist pattern PR5 may include a first photo region PH1 having a larger thickness, and a second photo region PH2 having a thickness less than that of the first photo region PH1.

Subsequently, a sixth etching process (6etch) of etching the first via material layer 165' by dry etching is carried out using the fifth photoresist pattern PR5 as a mask. A plurality of via holes exposing the interlayer dielectric layer 160 thereunder may be formed in the first via material layer 165' via the sixth etching process (6etch). Specifically, in the first via material layer 165', a first via hole VIA1 overlapping the connection pattern layer 152, a second via hole VIA2 overlapping a portion of the semiconductor layer 140, a third via hole VIA3 exposing another portion of the semiconductor layer 140, and a fourth via hole VIA4 overlapping the upper pad electrode 156 are formed.

Figure 14:
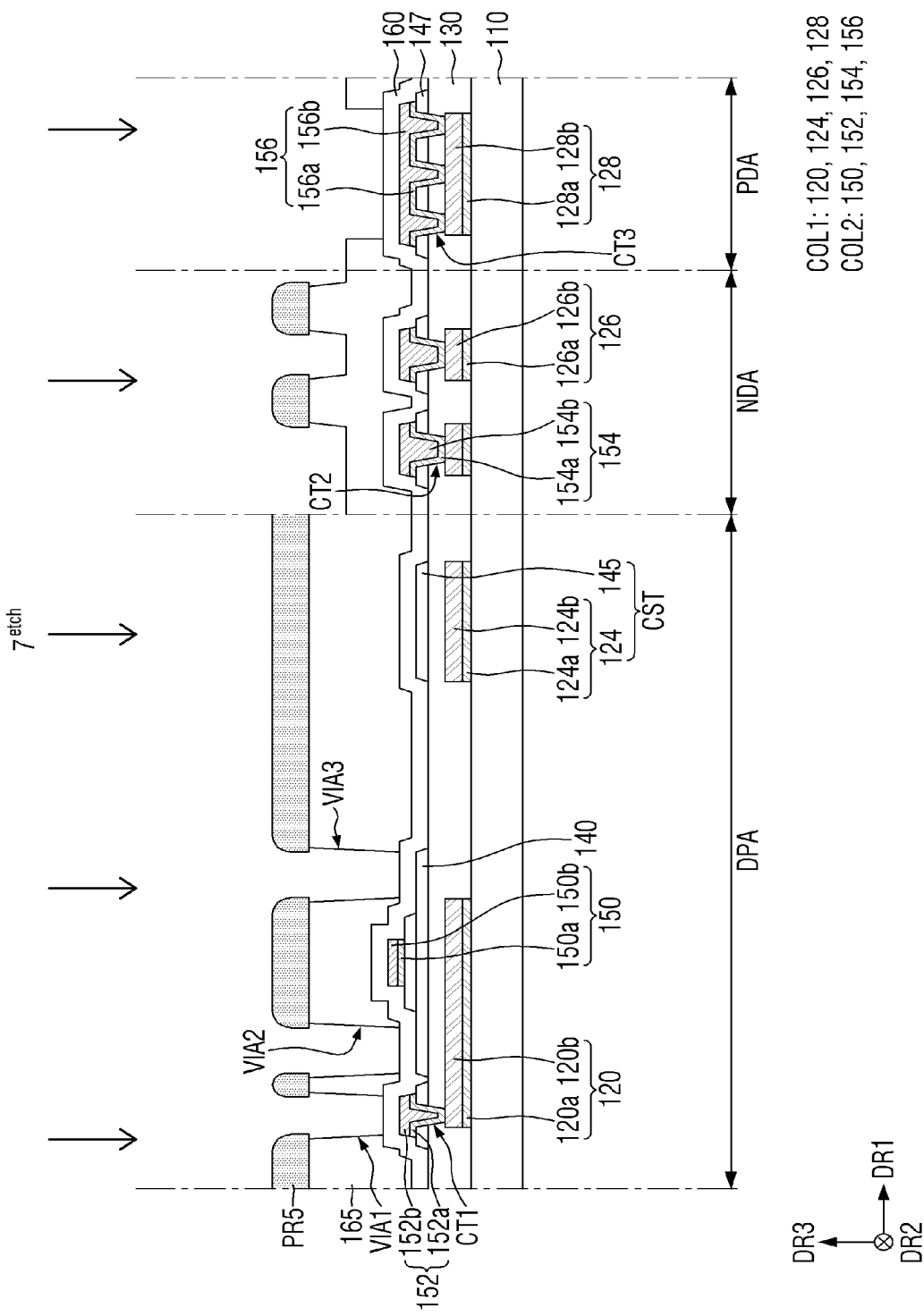

Subsequently, referring to FIG. 14, the fifth photoresist pattern PR5 is ashed. In the ashing process, the thickness of the fifth photoresist pattern PR5 is reduced, so that the second photo region PH2 is removed while only the first photo region PH1 remains. Subsequently, a seventh etching process (7etch) of etching the first via material layer 165' is carried out using the fifth photoresist pattern PR5 as a mask. In the seventh etching process (7etch), the first via material layer 165' that is not masked by the fifth photoresist pattern PR5 may be etched out to form the via layer 165. For example, the first via material layer 165' may be etched out to a predetermined thickness in the non-display area NDA and the pad area PDA. These regions may be easily removed completely during a process to be described later.

Figure 15:
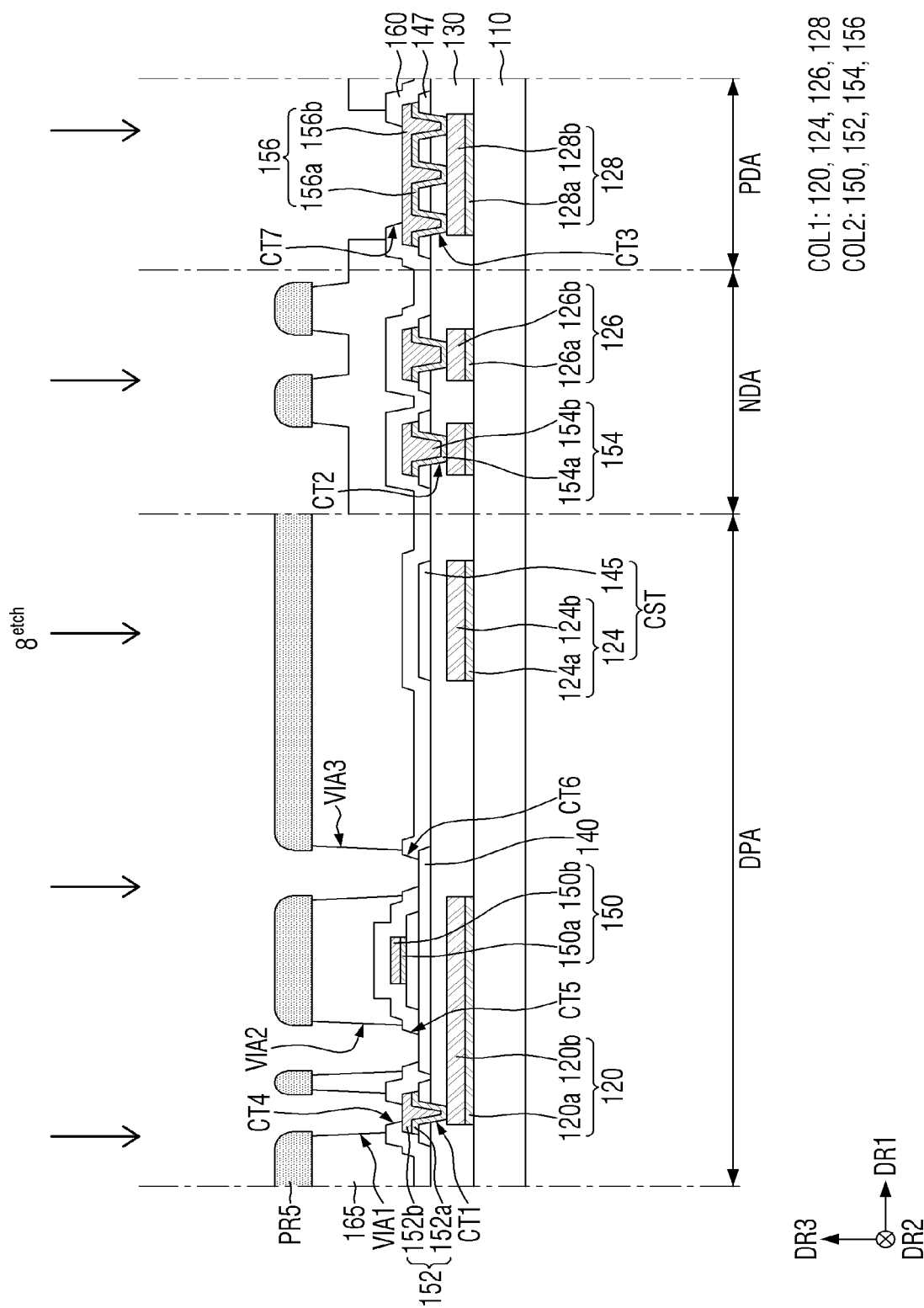
Figure 16:
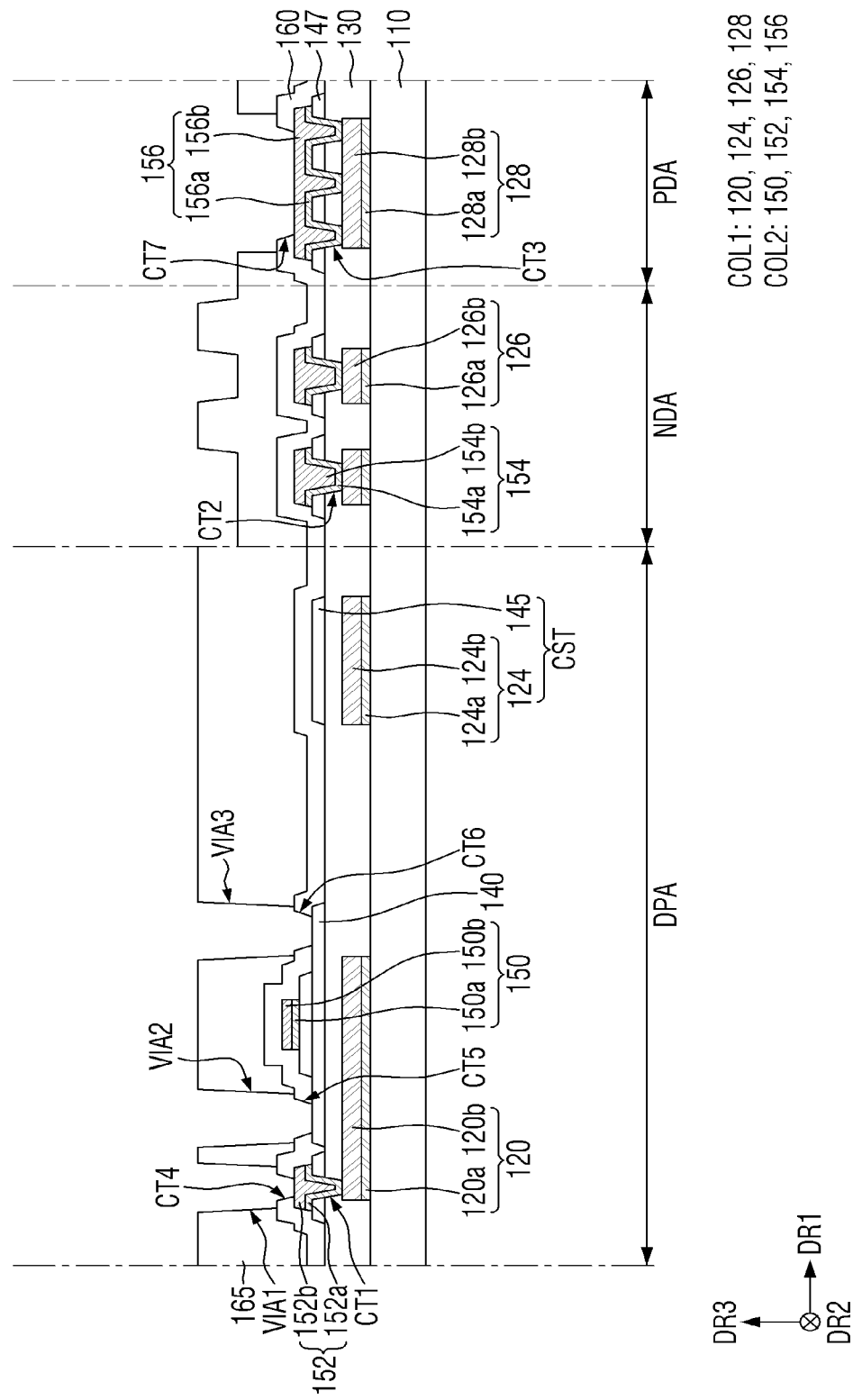

Subsequently, referring to FIGS. 15 and 16, an eighth etching process (8etch) of etching the interlayer dielectric layer 160 exposed by the first to fourth via holes VIA1, VIA2, VIA3 and VIA4 using the fifth photoresist pattern PR5 as a mask. Specifically, in the interlayer dielectric 160, a fourth contact hole CT4 exposing the connection pattern layer 152 is formed, a fifth contact hole CT5 exposing a portion of the semiconductor layer 140 is formed, a sixth contact hole CT6 exposing another portion of the semiconductor layer 140 is formed, and a seventh contact hole CT7 exposing the upper pad electrode 156 is formed.

Figure 17:
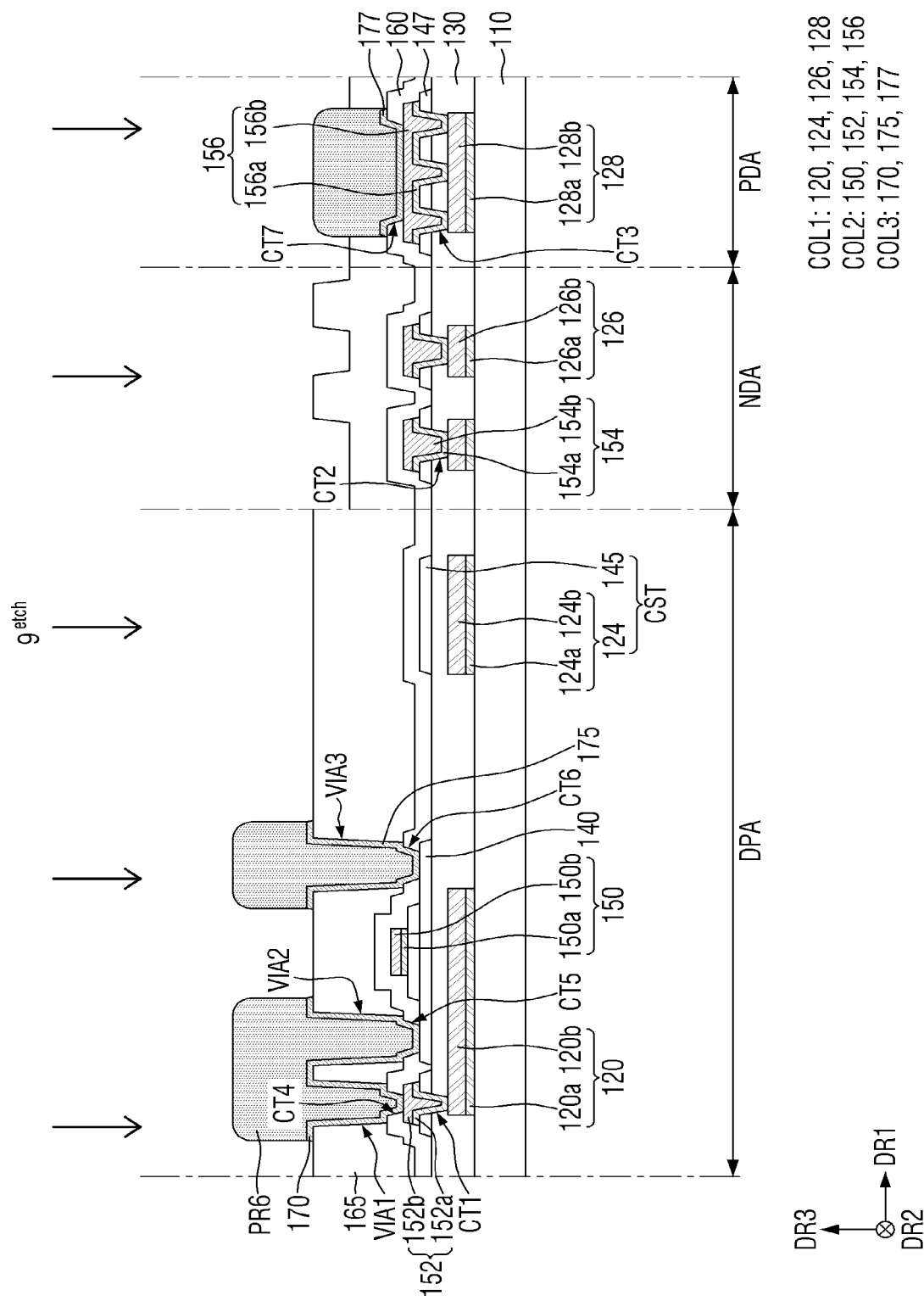

Subsequently, referring to FIG. 17, a patterned first bridge layer 170, a second bridge layer 175 and a pad capping layer 177 are formed on the via layer 165 formed on the first substrate 110. The first bridge layer 170, the second bridge layer 175 and the pad capping layer 177 may be formed via a sixth mask process. For example, a bridge material layer is deposited on the first substrate 110, a photoresist is applied on the bridge material layer, and a sixth photoresist pattern PR6 is formed by exposure and development. Subsequently, a ninth etching process (9etch) of etching the bridge material layer by ejecting an etchant using the sixth photoresist pattern PR6 as a mask is carried out.

A first bridge layer 170, a second bridge layer 175, and a pad capping layer 177 may be formed by the ninth etching process (9etch). The first bridge layer 170 may be in contact with the connection pattern layer 152 through the first via hole VIA1 and the fourth contact hole CT4, and may be in contact with a portion of the semiconductor layer 140 through the second via hole VIA2 and the fifth contact hole CT5. The second bridge layer 175 may be in contact with another portion of the semiconductor layer 140 through the third via hole VIA3 and the sixth contact hole CT6. The pad capping layer 177 may be in contact with the upper pad electrode 156 through the fourth via hole VIA4 and the seventh contact hole CT7. Subsequently, the sixth photoresist pattern PR6 is removed by stripping or ashing it.

Subsequently, the first substrate 110 is subjected to heat treatment to convert the pad capping layer 177 into a polycrystalline phase. The pad capping layer 177 may include the same material as the first pixel layer 180a of the pixel electrode 180, to be described later, and thus may be etched by the etchant for the pixel electrode 180. According to this embodiment, the pad capping layer 177 may be converted into a polycrystalline phase so that it is not etched by the etchant for the pixel electrode 180. The first bridging layer 170 and the second bridging layer 175 may also be converted into a polycrystalline phase by the heat treatment of the first substrate 110. The heat treatment may be carried out at approximately 150 to 200 degrees Celsius for several minutes to several tens of minutes.

Figure 18:
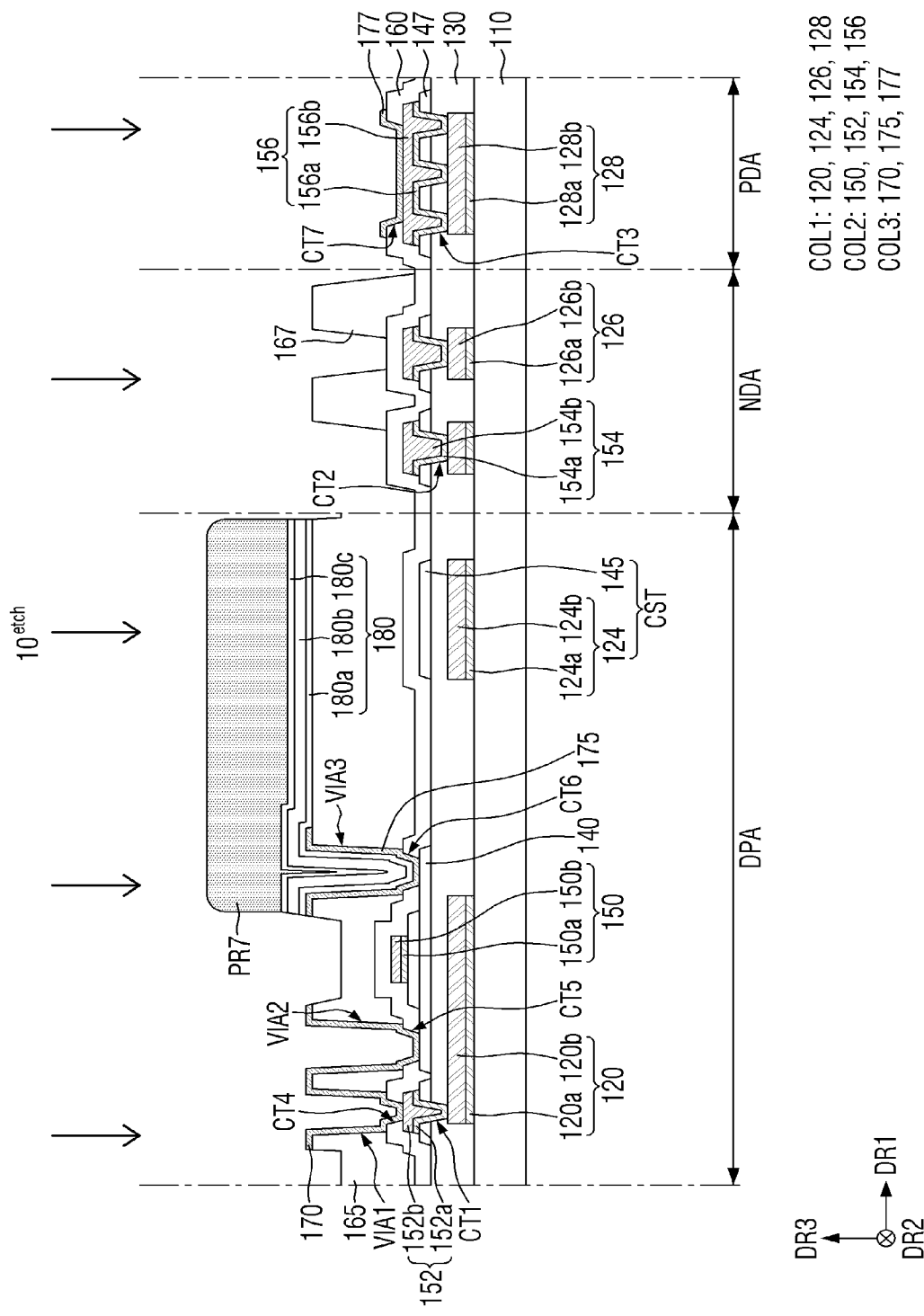

Subsequently, referring to FIG. 18, a patterned pixel electrode 180 is formed on the first substrate 110 on which the first bridge layer 170, the second bridge layer 175, and the pad capping layer 177 are formed. The pixel electrode 180 may be formed via a seventh mask process. For example, a first electrode material layer, a second electrode material layer, and a third electrode material layer are sequentially stacked on the first substrate 110, a photoresist is applied on the third electrode material layer, and a seventh photoresist pattern PR7 is formed by exposure and development. Subsequently, a tenth etching process (10etch) of ejecting an etchant using the seventh photoresist pattern PR7 as a mask to etch the first electrode material layer, the second electrode material layer, and the third electrode material layer is carried out.

The pixel electrode 180 in which the first pixel layer 180a, the second pixel layer 180b, and the third pixel layer 180c are stacked on one another may be formed by the tenth etching process (10etch). The pixel electrode 180 may be electrically connected to another portion of the semiconductor layer 140 through the second bridge layer 175 by filling the third via hole VIA3.

Subsequently, an ashing process of partially removing the via layer 165 using the seventh photoresist pattern PR7 and the first bridge layer 170 as a mask is carried out. By the ashing process, the exposed via layer 165 may be partially removed to have a reduced thickness. As described above, the via layer 165 in the non-display area NDA and the pad area PDA remains with a reduced thickness. By this ashing process, the via layer 165 having a reduced thickness in the non-display area NDA and the pad area PDA is removed, while the via layer 165 remaining in the non-display area NDA may be formed as a lower dam layer 167. According to this embodiment, the seventh photoresist pattern PR7 and the first bridge layer 170 are used as masks, but the inventive concepts are not limited thereto. After the seventh photoresist pattern PR7 has been removed, the first bridge layer 170 and the pixel electrode 180 may be used as a mask.

Figure 19:
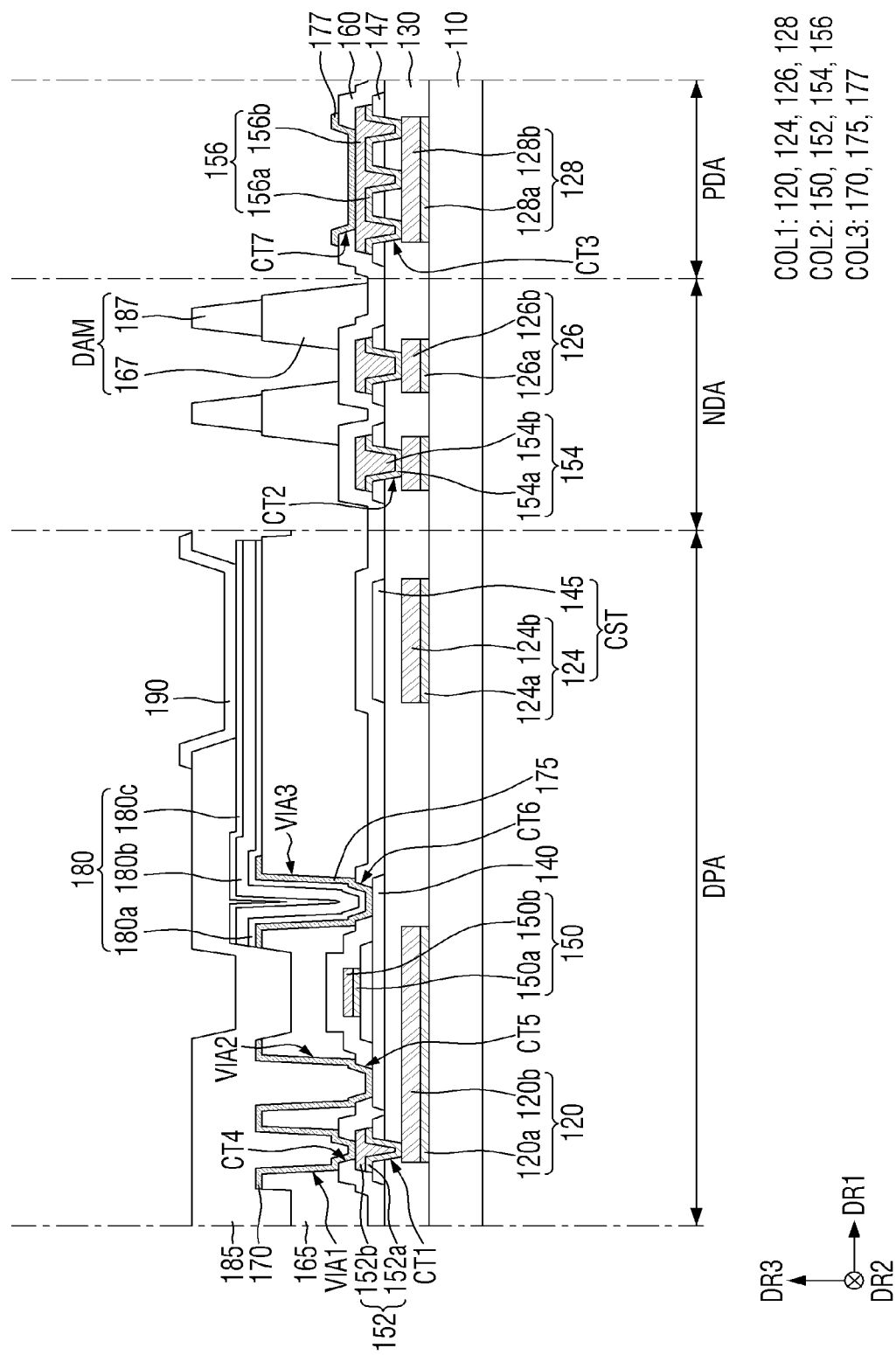

Subsequently, referring to FIG. 19, a pixel-defining layer 185 and an upper dam layer 187 are formed on the pixel electrode 180 and the lower dam layer 167 formed on the first substrate 110. The pixel-defining layer 185 and the upper dam layer 187 may be formed via an eighth mask process. For example, an eleventh etching process of coating a pixel-defining layer material layer on the first substrate 110 and applying a photoresist on the pixel-defining layer material layer, followed by exposure and development using the eighth photoresist pattern as a mask to etch the pixel-defining layer material layer is carried out. During the eleventh etching process, an opening exposing the pixel electrode 180 may be formed in the pixel-defining layer 185, and an upper dam layer 187 may be formed in the non-display area NDA. All of the pixel-defining layer 185 may be removed from the pad area PDA.

Subsequently, a light-emitting layer 190 is deposited on the pixel-defining layer 185 and the pixel electrode 180. The light-emitting layer 190 may be formed by inkjet printing or chemical vapor deposition.

Figure 20:
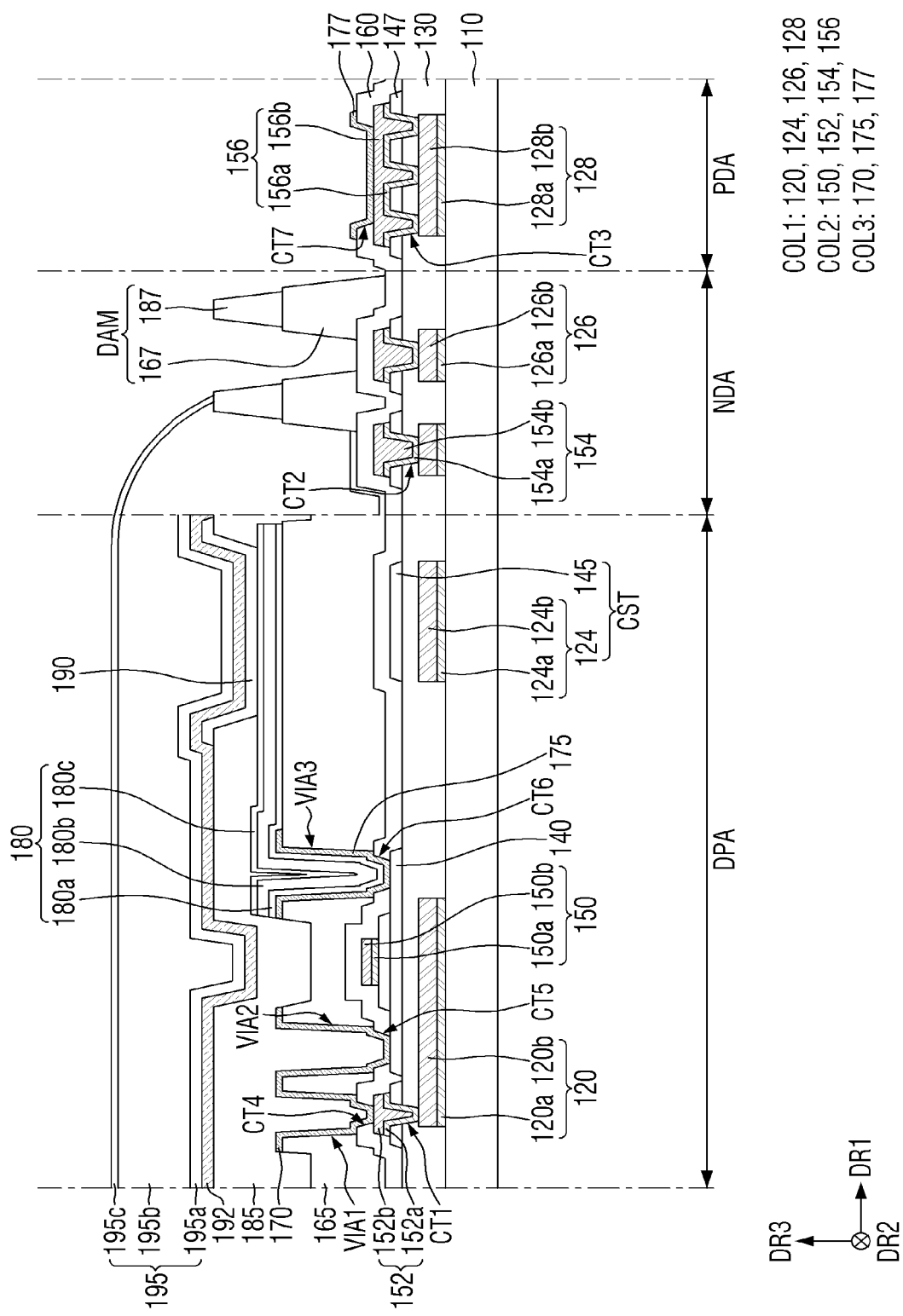

Subsequently, referring to FIG. 20, a common electrode 192 is deposited on the light-emitting layer 190 formed on the first substrate 110. The common electrode 192 may be deposited throughout the entire display area DPA. Subsequently, a thin-film encapsulation structure 195 is formed by sequentially forming a first inorganic layer 195a, an organic layer 195b, and a second inorganic layer 195b on the common electrode 192 formed on the first substrate 110. The thin-film encapsulation structure 195 cannot spread to the pad area PDA or the non-display area NDA due to the dam DAM disposed in the non-display area NDA.

As described above, according to this embodiment, the light-blocking layer and the semiconductor layer may be connected by using the first bridge layer, which is the third conductive layer, while eliminating the source/drain electrode layer. In addition, a connection pattern layer may be formed using the same second conductive layer as the gate electrode to connect the first bridge layer with the light-blocking layer. In addition, the pad capping layer, which is the third conductive layer, may be converted into a polycrystalline phase, so that it can cover and protect pad electrodes. As described above, according to this embodiment, the process can be simplified by replacing the source/drain electrode layer with the third conductive layer, otherwise the complicated process of forming the source/drain electrode layer should be carried out.

Hereinafter, other embodiments of the present invention will be described. In the following description, the same or similar elements will be denoted by the same or similar reference numerals, and redundant descriptions will be omitted or briefly described. Descriptions will focus on differences from the above embodiment.

Figure 21:
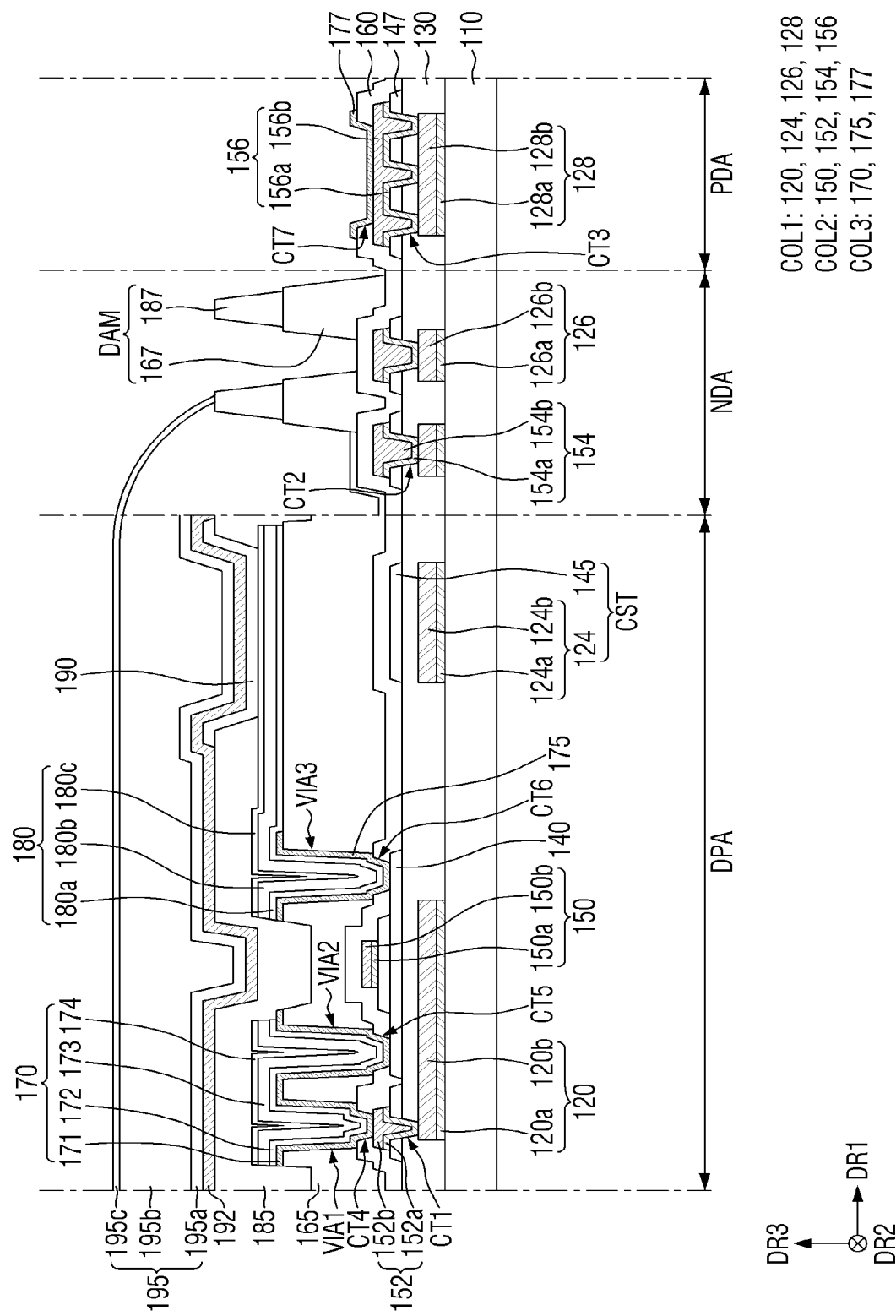
FIG. 21 is a cross-sectional view showing a display device according to another embodiment of the present invention.
Figure 22:
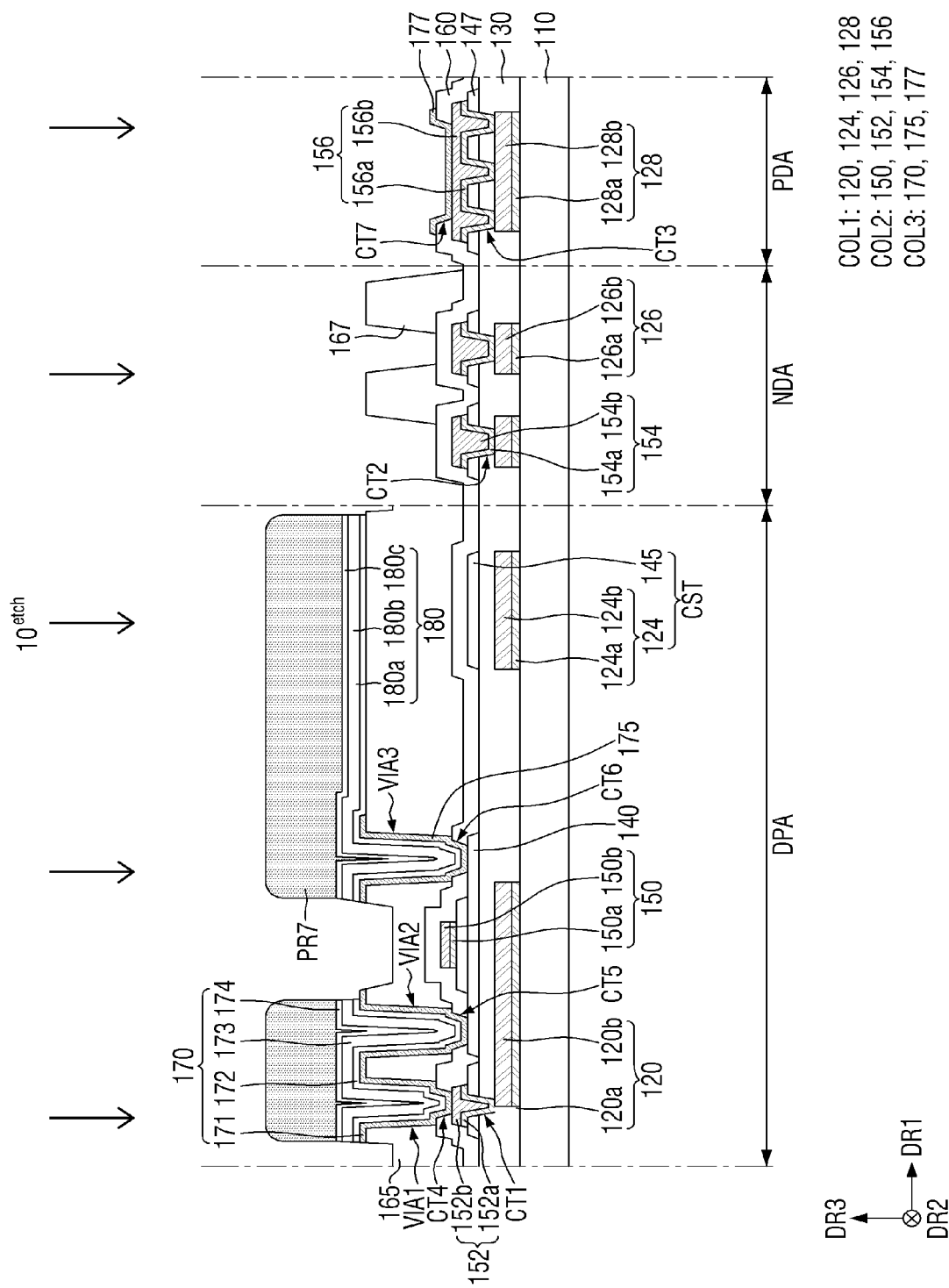
FIG. 22 is a cross-sectional view for illustrating a method of fabricating a display device according to another embodiment of the present invention.

FIG. 21 is a cross-sectional view showing a display device according to another embodiment of the present invention. FIG. 22 is a cross-sectional view for illustrating a method of fabricating a display device according to another embodiment of the present invention.

The embodiment of FIG. 21 is different from the embodiment of FIG. 5 described above in that a first bridge layer 170 is formed of multiple layers. The following description will focus on the difference and the redundant description will be omitted.

The first bridge layer 170 may include a first electrode layer 171, a second electrode layer 172 disposed on the first electrode layer 171, a third electrode layer 173 disposed on the second electrode layer 172, and a fourth electrode layer 174 disposed on the third electrode layer 173.

The first electrode layer 171, the second electrode layer 172, and the fourth electrode layer 174 may include a metal oxide such as ITO, IZO, ZnO and $In_2O_3$. The third electrode layer 173 may include a reflective material such as silver (Ag), magnesium (Mg), aluminum (Al), platinum (Pt), lead (Pb), gold (Au), nickel (Ni), neodymium (Nd), iridium (Ir), chrome (Cr), lithium (Li), calcium (Ca), or a mixture thereof. For example, the first bridge layer 170 may have a multilayer structure of ITO/ITO/Ag/ITO. In addition, the first electrode layer 171 may include a polycrystalline metal oxide like the above-described second bridge layer 175.

In addition, the second electrode layer 172 may include the same material as the first pixel layer 180a of the pixel electrode 180, the third electrode layer 173 may include the same material as the second pixel layer 180b of the pixel electrode 180, and the fourth electrode layer 174 may include the same material as the third pixel layer 180c of the pixel electrode 180.

According to this embodiment, the first bridge layer 170 includes the second electrode layer 172, the third electrode layer 173, and the fourth electrode layer 174 disposed on the first electrode layer 171, so that the physical characteristics of the structure of the bridge layer 170, e.g., the durability from short circuits, cracks, etc. can be improved.

The above-described first bridge layer 170 may be fabricated as described below.

Referring to FIG. 22, the first bridge layer 170 including patterned second electrode layer 172, third electrode layer 173, and fourth electrode layer 174, is formed on the first substrate 110 on which the first bridge layer 170 including the first electrode layer 171, the second bridge layer 175, and the pad capping layer 177 are formed, and the pixel electrode 180 is formed.

The second electrode layer 172, the third electrode layer 173, and the fourth electrode layer 174 of the first bridge layer 170, and the pixel electrode 180 may be simultaneously formed via the seventh mask process. For example, a first electrode material layer, a second electrode material layer and a third electrode material layer are sequentially stacked on the first substrate 110, a photoresist is applied on the third electrode material layer, followed by exposure and development, to form a seventh photoresist pattern PR7. Subsequently, a tenth etching process (10etch) of ejecting an etchant using the seventh photoresist pattern PR7 as a mask to etch the first electrode material layer, the second electrode material layer and the third electrode material layer is carried out.

By the tenth etching process (10etch), the second electrode layer 172, the third electrode layer 173, and the fourth electrode layer 174 are stacked on the first electrode layer 171 of the first bridge layer 170, and thus the first bridge layer 170 can be fabricated. In addition, the pixel electrode 180 in which the first pixel layer 180a, the second pixel layer 180b, and the third pixel layer 180c are stacked on one another may be formed.

In concluding the detailed description, those skilled in the art will appreciate that many variations and modifications can be made to the disclosed embodiments without substantially departing from the principles of the present invention. Therefore, the disclosed embodiments of the invention are used in a generic and descriptive sense only and not for purposes of limitation, and it is intended that the inventive concepts cover the many variations and modifications provided they come within the scope of the appended claims and their equivalents.

What is claimed is:

1. A display device comprising:
a light-blocking layer disposed on a substrate;
a buffer layer disposed on the light-blocking layer;
a semiconductor layer disposed on the buffer layer;
a gate insulating layer disposed on the semiconductor layer;
a connection pattern layer and a gate electrode disposed on the gate insulating layer and spaced apart from each other;
an interlayer dielectric layer disposed on the connection pattern layer and the gate electrode;
a via layer disposed on the interlayer dielectric layer;
a first bridge layer and a second bridge layer disposed on the via layer;
a pixel electrode disposed on the second bridge layer;
a light-emitting layer disposed on the pixel electrode; and
a common electrode disposed on the light-emitting layer, wherein:
a first end of the first bridge layer is connected to the light-blocking layer through the connection pattern layer, and a second end of the first bridge layer is connected to the semiconductor layer,
the second bridge layer connects the semiconductor layer with the pixel electrode, and
a portion of the pixel electrode is directly disposed on and directly contacts the via layer.

2. The display device of claim 1, wherein the connection pattern layer and the gate electrode are disposed on a same layer and include a same material.

3. The display device of claim 1, wherein the connection pattern layer is in contact with the light-blocking layer through a first contact hole penetrating the gate insulating layer and the buffer layer.

4. The display device of claim 3, wherein the first end of the first bridge layer is in contact with the connection pattern layer through a second contact hole penetrating the interlayer dielectric layer and a first via hole penetrating the via layer.

5. The display device of claim 4, wherein
the second end of the first bridge layer is in contact with a first portion of the semiconductor layer through a third contact hole penetrating the interlayer dielectric layer and a second via hole penetrating the via layer.

6. The display device of claim 5, wherein
the second bridge layer is in contact with a second portion of the semiconductor layer through a fourth contact hole penetrating the interlayer dielectric layer and a third via hole penetrating the via layer, and
a portion of the pixel electrode is disposed in the third via hole.

7. The display device of claim 1, wherein the first bridge layer and the second bridge layer comprise a metal oxide, and the metal oxide comprises one selected from a group consisting of: ITO, IZO, ZnO, and $In_2O_3$.

8. The display device of claim 1, wherein the first bridge layer and the second bridge layer comprise a polycrystalline metal oxide.

9. The display device of claim 1, wherein the first bridge layer comprises:
a first electrode layer;
a second electrode layer disposed on the first electrode layer;
a third electrode layer disposed on the second electrode layer; and
a fourth electrode layer disposed on the third electrode layer.

10. The display device of claim 9, wherein:
the first electrode layer, the second electrode layer and the fourth electrode layer comprise a metal oxide; and
the first electrode layer comprises a polycrystalline metal oxide.

11. A display device comprising:
a substrate comprising a display area and a pad area;
a light-blocking layer disposed on the display area of the substrate, and a lower pad electrode disposed on the pad area of the substrate;
a buffer layer disposed on the light-blocking layer and the lower pad electrode;
a semiconductor layer disposed on the buffer layer and overlapping the light-blocking layer;
a gate insulating layer disposed on the semiconductor layer;
a connection pattern layer and a gate electrode disposed on the gate insulating layer in the display area, and an upper pad electrode disposed on the gate insulating layer in the pad area and overlapping the lower pad electrode;
an interlayer dielectric layer disposed on the connection pattern layer, the gate electrode and the lower pad electrode;
a via layer disposed on the interlayer dielectric layer, the via layer is comprised of an organic insulating material;
a first bridge layer and a second bridge layer disposed on the via layer in the display area, and a pad capping layer disposed on the pad area and overlapping the upper pad electrode;
a pixel electrode disposed on the second bridge layer;
a light-emitting layer disposed on the pixel electrode; and
a common electrode disposed on the light-emitting layer, wherein
the first bridge layer, the second bridge layer, and the pad capping layer comprise a polycrystalline metal oxide,
the first bridge layer, the second bridge layer, and the pad capping layer are formed from a same layer and are comprised of a same material.

12. The display device of claim 11, wherein the upper pad electrode is in contact with the lower pad electrode through a first contact hole penetrating the buffer layer and the gate insulating layer.

13. The display device of claim 12, wherein the pad capping layer is in contact with the upper pad electrode through a second contact hole penetrating the interlayer dielectric layer.

14. The display device of claim 11, wherein:
a first end of the first bridge layer is connected to the light-blocking layer through the connection pattern layer;
a second end of the first bridge layer is connected to the semiconductor layer; and
the second bridge layer connects the semiconductor layer with the pixel electrode.

15. The display device of claim 14, wherein the connection pattern layer is in contact with the light-blocking layer through a third contact hole penetrating the gate insulating layer and the buffer layer.

16. The display device of claim 15, wherein:
the first end of the first bridge layer is in contact with the connection pattern layer through a fourth contact hole penetrating the interlayer dielectric layer and a first via hole penetrating the via layer;
the second end of the first bridge layer is in contact with a portion of the semiconductor layer through a fifth contact hole penetrating the interlayer dielectric layer and a second via hole penetrating the via layer; and
the second bridge layer is in contact with another portion of the semiconductor layer through a sixth contact hole penetrating the interlayer dielectric layer and a third via hole penetrating the via layer, and
the pixel electrode is disposed in the third via hole.

17. The display device of claim 16, wherein the first bridge layer, the second bridge layer and the pad capping layer comprise one selected from a group consisting of: ITO, IZO, ZnO, and $In_2O_3$.

18. A method of fabricating a display device, the method comprising:
forming a light-blocking layer and a lower pad electrode on a substrate;
forming a buffer layer on the light-blocking layer and the lower pad electrode;
forming a semiconductor layer overlapping the light-blocking layer on the buffer layer;
forming a gate insulating layer on the semiconductor layer;
forming a connection pattern layer, a gate electrode and an upper pad electrode on the gate insulating layer;
forming an interlayer dielectric layer on the connection pattern layer, the gate electrode and the upper pad electrode;
forming a via layer on the interlayer dielectric layer;
forming a first bridge layer and a second bridge layer on the via layer, and forming a pad capping layer overlapping the upper pad electrode;
converting the first bridge layer, the second bridge layer and the pad capping layer into a polycrystalline phase;
forming a pixel electrode on the second bridge layer;
forming a light-emitting layer on the pixel electrode; and
forming a common electrode on the light-emitting layer.

19. The method of claim 18, wherein the converting comprises performing heat treatment on the substrate on which the first bridge layer, the second bridge layer, and the pad capping layer are formed at a temperature of 150 to 200 degrees Celsius.

20. The method of claim 18, wherein the connection pattern layer, the gate electrode, and the upper pad electrode are formed via a same mask process.

21. The method of claim 18, comprising:
prior to the forming of the connection pattern layer, the gate electrode and the upper pad electrode, etching the gate insulating layer and the buffer layer to form a first contact hole exposing the light-blocking layer and a second contact hole exposing the lower pad electrode,
wherein the connection pattern layer is in contact with the light-blocking layer through the first contact hole, and the upper pad electrode is in contact with the lower pad electrode through the second contact hole.

22. The method of claim 21, comprising:
after the forming of the via layer on the interlayer insulating layer, etching the via layer and the interlayer dielectric layer, to form a third contact hole and a first via hole exposing the connection pattern layer, and to form a fourth contact hole and a second via hole exposing the lower pad electrode,
wherein the first bridge layer is in contact with the connection pattern layer through the third contact hole and the first via hole, and the pad capping layer is in contact with the upper pad electrode through the fourth contact hole and the second via hole.

23. The display device of claim 11, wherein a portion of the pixel electrode is disposed directly on the via layer.

24. The display device of claim 11, wherein the pad area is external to the display area and is electrically connected to a plurality of external devices.

25. The display device of claim 1, wherein the via layer is comprised of an organic insulating material selected from polyacrylate resin, epoxy resin, phenolic resin, polyamide resin, polyimide resin, unsaturated polyesters resin, polyphenylene ether resin, polyphenylene sulfide resin, and benzocyclobutene (BCB).

26. An electronic device comprising:
a light-blocking layer disposed on a substrate;
a buffer layer disposed on the light-blocking layer;
a semiconductor layer disposed on the buffer layer;
a gate insulating layer disposed on the semiconductor layer;
a connection pattern layer and a gate electrode disposed on the gate insulating layer and spaced apart from each other;
an interlayer dielectric layer disposed on the connection pattern layer and the gate electrode;
a via layer disposed on the interlayer dielectric layer;
a first bridge layer and a second bridge layer disposed on the via layer;
a pixel electrode disposed on the second bridge layer;
a light-emitting layer disposed on the pixel electrode; and
a common electrode disposed on the light-emitting layer,
wherein:
a first end of the first bridge layer is connected to the light-blocking layer through the connection pattern layer, and a second end of the first bridge layer is connected to the semiconductor layer,
the second bridge layer connects the semiconductor layer with the pixel electrode, and
a portion of the pixel electrode is directly disposed on and directly contacts the via layer.

* * * * *